US012490609B2

(12) United States Patent
Shin et al.

(10) Patent No.: US 12,490,609 B2
(45) Date of Patent: Dec. 2, 2025

(54) DISPLAY DEVICE COMPRISING AN OPTICAL AREA WITHOUT A SIGNAL LINE

(71) Applicant: LG Display Co., Ltd., Seoul (KR)

(72) Inventors: Mihee Shin, Goyang-si (KR); Soonsung Ahn, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/582,133

(22) Filed: Feb. 20, 2024

(65) Prior Publication Data

US 2024/0284733 A1 Aug. 22, 2024

(30) Foreign Application Priority Data

Feb. 22, 2023 (KR) ........................ 10-2023-0023767

(51) Int. Cl.

*G09G 3/3233* (2016.01)
*H10K 59/131* (2023.01)

(52) U.S. Cl.

CPC ......... *H10K 59/131* (2023.02); *G09G 3/3233* (2013.01); *G09G 2300/0819* (2013.01); *G09G 2300/0842* (2013.01)

(58) Field of Classification Search

CPC ... G09G 3/32–3291; G09G 2300/0408; G09G 2300/0413; G09G 2300/0426; G09G 2300/0819; G09G 2300/0842; G09G 2310/0205; G09G 2310/0232; G09G 2310/0267; G09G 2310/0283; G09G 2310/04; G09G 2310/06; G09G 2310/08; G09G 2320/0233–0242; G09G 2320/0686

See application file for complete search history.

(56) References Cited

U.S. PATENT DOCUMENTS

| | | | | |
|---|---|---|---|---|
| 10,847,599 | B2 | 11/2020 | Jeon et al. | |
| 11,653,535 | B2 | 5/2023 | Jeon et al. | |
| 2020/0098843 | A1 | 3/2020 | Jeon et al. | |
| 2020/0176551 | A1* | 6/2020 | Park | G09G 3/3225 |
| 2021/0043716 | A1 | 2/2021 | Jeon et al. | |
| 2021/0193757 | A1 | 6/2021 | Kim et al. | |
| 2022/0189377 | A1* | 6/2022 | Wang | G09G 3/3266 |

FOREIGN PATENT DOCUMENTS

| | | |
|---|---|---|
| KR | 10-2020-0034902 A | 4/2020 |
| KR | 10-2021-0079792 A | 6/2021 |

* cited by examiner

*Primary Examiner* — Nathan Danielsen
(74) *Attorney, Agent, or Firm* — Fenwick & West LLP

(57) ABSTRACT

A display device includes a substrate which includes a display area including at least one optical area and a normal area and including a plurality of pixels and a non-display area and a plurality of signal lines extending from both sides of the display area to the plurality of pixels in a row direction, wherein the plurality of signal lines includes a first signal line and a second signal line which are disposed on different rows on both sides of the optical area and transmit the same signal and a detour line which is connected to the first signal line and the second signal line on the both sides of the at least one optical area and detours the at least one optical area.

18 Claims, 18 Drawing Sheets

DISPLAY DEVICE COMPRISING AN OPTICAL AREA WITHOUT A SIGNAL LINE

CROSS-REFERENCE TO RELATED APPLICATION

This application claims the benefit and priority of Republic of Korea Patent Application No. 10-2023-0023767 filed on Feb. 22, 2023, in the Korean Intellectual Property Office, which is hereby incorporated by reference in its entirety.

BACKGROUND

Field

The present disclosure relates to a display device, and more particularly, to a display device which improves a visual characteristic of an area in which a camera module or a sensor is disposed and improves a performance of a camera module or a sensor.

Description of the Related Art

As it enters the information era, a field of a display device which visually expresses electrical information signals has been rapidly developed and studies are continued to improve performances of various display devices, such as a thin-thickness, a light weight, and low power consumption.

A representative display device may include a liquid crystal display (LCD) device, a field emission display (FED) device, an electro-wetting display (EWD) device, an organic light emitting display (OLED) device, an inorganic light emitting display, quantum dot light emitting display, plasma display device and the like.

An electroluminescent display device which is represented by an organic light emitting display device is a self-emitting display device so that a separate light source is not necessary, which is different from a liquid crystal display device. Therefore, the electroluminescent display device may be manufactured to have a light weight and a small thickness. Further, since the electroluminescent display device is advantageous not only in terms of power consumption due to the low voltage driving, but also in terms of color implementation, a response speed, a viewing angle, a contrast ratio (CR), it is expected to be utilized in various fields.

Recently, a multi-media function of a mobile terminal is being improved. For example, a camera module or a sensor is basically embedded on a front surface of the display device. In order to reduce a space occupied by a camera module or a sensor on the front surface of the display device, a design including a notch or a punch hole has been employed for the display device. Further, various other methods for arranging a camera and/or various sensors for a full-screen configuration have been proposed.

SUMMARY

An object to be achieved by the present disclosure is to provide a display device which improves a luminosity factor of an area in which a camera module or a sensor is disposed in the display device.

Another object to be achieved by the present disclosure is to provide a display device which improves a performance of a camera module or a sensor by improving a transmittance in an area in which the camera module or the sensor is disposed.

Objects of the present disclosure are not limited to the above-mentioned objects, and other objects, which are not mentioned above, can be clearly understood by those skilled in the art from the following descriptions.

A display device according to an exemplary embodiment of the present disclosure includes a substrate which includes a display area including at least one optical area and a normal area and including a plurality of pixels and a non-display area and a plurality of signal lines extending from both sides of the display area to the plurality of pixels in a row direction, wherein the plurality of signal lines includes a first signal line and a second signal line which are disposed on different rows on both sides of the optical area and transmit the same signal and a detour line which is connected to the first signal line and the second signal line on the both sides of the at least one optical area and detours the at least one optical area.

Other detailed matters of the exemplary embodiments are included in the detailed description and the drawings.

According to the present disclosure, in the display device, a signal line for driving is not disposed in an optical area so that the transmittance is further increased, thereby improving a performance of an optical electronic device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

Figure 1:
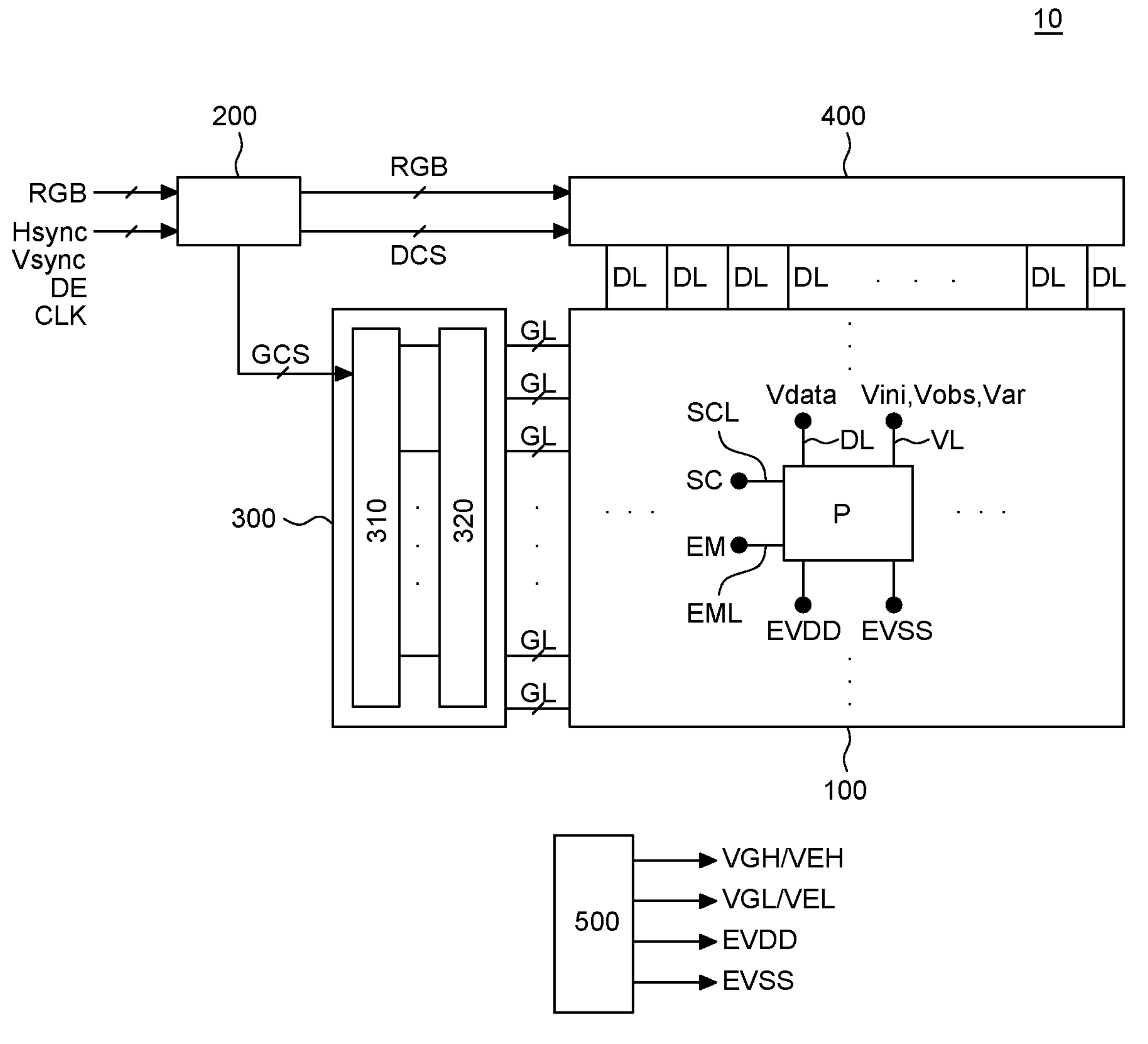
FIG. 1 is a block diagram schematically illustrating a display device according to an exemplary embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and convenience.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, dimensions, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "containing," "formed of," "comprising", and "having" used herein are generally intended to allow other components to be added unless the terms are used with a more limiting term such as "merely", "only", etc. Any references to singular may include plural unless expressly stated otherwise.

Components are interpreted to include an ordinary error range even if not expressly stated.

When the position relation between two parts is described using the terms such as "on", "over", "under", "beneath", "above", "below", and "next", one or more parts may be positioned between the two parts unless the terms are used with a more limiting term such as "just", "immediately" or "directly".

When an element or layer is disposed "on" another element or layer, a further layer or another element may be interposed directly on the other element or therebetween.

Throughout the present disclosure, "pixel" and "sub pixel" are used interchangeably.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

FIG. 1 is a block diagram schematically illustrating a display device according to an exemplary embodiment of the present disclosure.

Referring to FIG. 1, the display device 10 at least includes a display panel 100 including a plurality of pixels P, a controller 200, a gate driver 300 which supplies a gate signal to each of the plurality of pixels P, a data driver 400 which supplies a data signal to each of the plurality of pixels P, and a power supply unit 500. The power supply unit 500 supplies a power required for driving to each of the plurality of pixels P and other components included in the display panel 100, such as VGH/VEH, VGL/VEL, EVDD, EVSS, etc.

The display panel 100 includes a display area DA (see FIG. 4) in which a pixel P is located and a non-display area NDA (see FIG. 4) which is disposed outside (e.g., in the vicinity of) the display area DA so as to at least partially enclose the display area DA and includes for example the gate driver 300 and the data driver 400.

In the display panel 100, the plurality of gate lines GL and the plurality of data lines DL intersect each other and the plurality of pixels P is connected to the gate lines GL and the data line DL, respectively and disposed at the intersection of the gate lines GL and the data line DL. Specifically, one pixel P is supplied with a gate signal from the gate driver 300 through the gate line GL, is supplied with a data signal from the data driver 400 through the data line DL, and is supplied with a high potential driving voltage EVDD and a low potential driving voltage EVSS from the power supply unit 500.

Here, the gate line GL supplies a scan signal SC and an emission control signal EM and the data line DL supplies a data voltage Vdata. Further, according to various exemplary embodiments, the gate line GL may include a plurality of scan lines SCL which supplies a scan signal SC and an emission control signal line EML which supplies the emission control signal EM. Further, the plurality of pixels P further includes a power line to be supplied with a bias voltage Vobs and initialization voltages Var and Vini.

Figure 3:
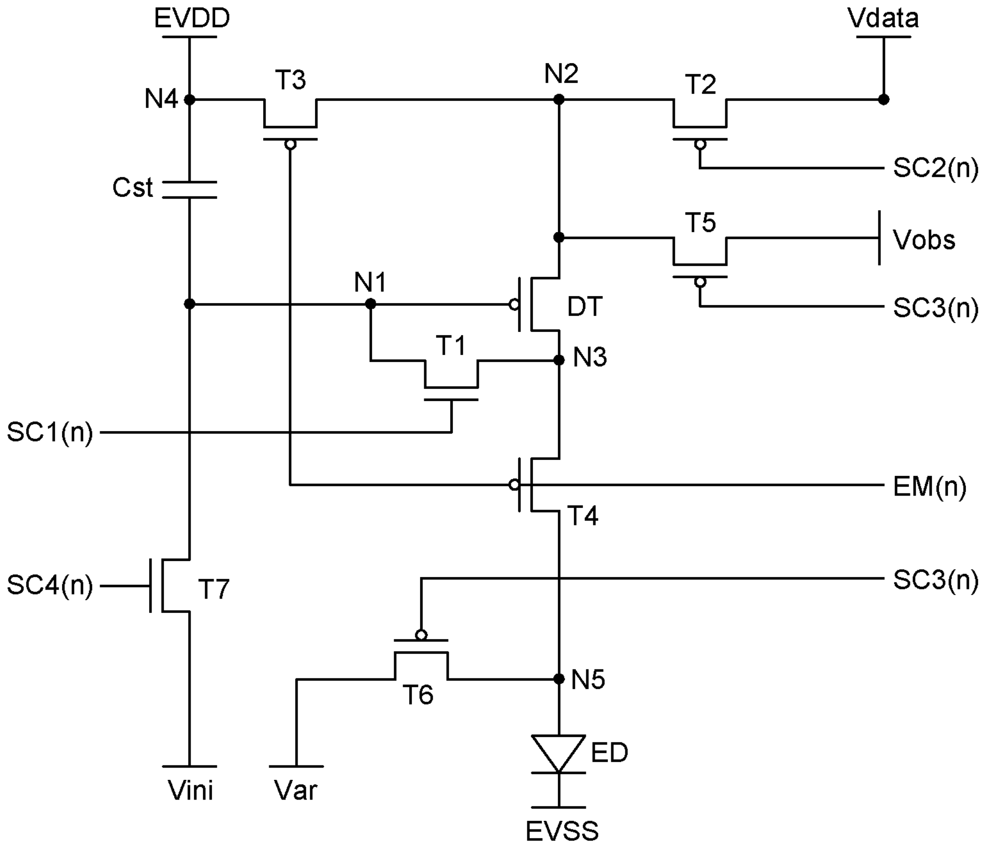
FIG. 3 is an equivalent circuit diagram of a sub pixel of a display device according to an exemplary embodiment of the present disclosure.

Further, each pixel P includes a light emitting diode ED and a pixel circuit which controls the driving of the light emitting diode ED, as illustrated in FIG. 3. Here, the light emitting diode ED is configured by an anode electrode AE, a cathode electrode CE, and an emission layer EL between the anode electrode AE and the cathode electrode CE. For example, the emission layer EL may include one or more of a hole injection layer (HIL), a hole transmitting layer (HTL), an electron transmitting layer (ETL) and an electron injection layer (EIL), but the present disclosure is not limited thereto.

The pixel circuit includes a plurality of switching elements, a driving element, and a capacitor. Here, the switching element and the driving element may be configured by thin film transistors (e.g., PMOS and/or NMOS thin film transistors). In the pixel circuit, the driving element controls an amount of current to be supplied to the light emitting diode ED in accordance with the data voltage to adjust an emission amount of the light emitting diode ED. Further, the plurality of switching elements receives a scan signal SC supplied through the plurality of scan lines SCL and an emission control signal EM supplied through the emission control line EML to operate the pixel circuit. Each of the plurality of pixel circuits may include the light emitting diode ED, a driving transistor DT, first to seventh transistors T1 to T7, and a capacitor Cst, but is not limited thereto, and may include more or less elements than shown. An example illustrated in FIG. 3 represents 7T1C structure that where seven transistors and one capacitor are disposed, but embodiments of the present disclosure are not limited to this.

The display panel 100 may be implemented by a non-transmissive display panel or a transmissive display panel. The transmissive display panel may be applied to a transparent display device in which an image is displayed on a screen and real objects in the background are visible. The display panel 100 may be manufactured by a flexible display panel. The flexible display panel may be implemented by an OLED panel which uses a plastic substrate. As the plastic substrate, polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), cyclic olefin copolymer (COC), triacetylcellulose (TAC) film, polyvinyl alcohol (PVA) film, and polystyrene (PS) may be used, but is not limited thereto.

Each pixel P may be divided into a red subpixel, a green subpixel, and a blue subpixel to implement colors, but is not limited thereto, and may be divided into subpixels of other colors such as cyan, magenta, yellow, black, etc. Each pixel P may further include a white pixel. Each pixel P includes a pixel circuit.

Touch sensors may be disposed on the display panel 100. The touch input may be sensed using separate touch sensors or sensed by pixels P. The touch sensors may be disposed on the screen of the display panel in an on-cell type or an add-on type or implemented as in-cell type touch sensors to be embedded in the display panel 100. In the add-on type, a display panel and the touch sensors are separately manufactured and then the touch sensors are attached to an upper substrate of the display panel. In the on-cell type, elements constituting the touch sensors are formed directly on the surface of the upper substrate of a display panel. In the in-cell type, elements constituting the touch sensors are mounted inside the display panel to thereby achieve a thin profile and increase the durability of the display device.

The controller 200 processes image data RGB input from the outside to be suitable for a size and a resolution of the display panel 100 to supply the processed image data to the data driver 400. The controller 200 generates a gate control signal GCS and a data control signal DCS using synchronization signals input from the outside, for example, a dot clock signal CLK, a data enable signal DE, a horizontal synchronization signal Hsync, and a vertical synchronization signal Vsync. The generated gate control signal GCS and data control signal DCS are supplied to the gate driver 300 and the data driver 400, respectively, to control the gate driver 300 and the data driver 400.

The controller 200 may be configured to be coupled with various processors such as a microprocessor, a mobile processor, or an application processor, depending on a device to be mounted.

A host system may be any one of a television (TV) system, a tablet computer, a laptop computer, a set top box, a navigation system, a personal computer (PC), a home theater system, a mobile device, a wearable device, and a vehicle system.

The controller 200 may multiply an input frame frequency by i and may control an operating timing of a display panel driver with a frame frequency of an input frame frequency i (i is a positive integer larger than 0) Hz. The input frame frequency is 60 Hz in a national television standards committee (NTSC) standard and is 50 Hz in a phase-alternating line (PAL) standard. In order to lower a refresh rate of the pixels P in the low-speed driving mode, the controller 200 may lower the frame frequency into a frequency ranging from 1 Hz to 30 Hz.

The controller 200 generates a signal to allow the pixel P to be driven at various refresh rates. For example, the controller 200 generates signals associated with the driving to allow the pixel P to be driven in a variable refresh rate (VRR) mode or to be switchable between a first refresh rate and a second refresh rate. For example, the controller 200 may drive the pixel P at various refresh rates by simply changing a rate of a clock signal, generating a synchronization signal to generate a horizontal blank or a vertical blank, or driving the gate driver 300 in a mask manner.

The controller 200 generates a gate control signal GCS for controlling an operating timing of the gate driver 300 and a data control signal DSC for controlling an operating timing of the data driver 400 based on timing signals Vsync, Hsync, and DE received from the host system during each display operation period. The controller 200 controls the operating timing of the display panel driver to synchronize the gate driver 300 and the data driver 400.

A voltage level of the gate control signal GCS output from the controller 200 is converted into gate-on voltages VGL and VEL and gate-off voltages VGH and VEH through a level shifter which is not illustrated to be supplied to the gate driver 300. The level shifter converts a low-level voltage of the gate control signal GCS into the gate low voltage VGL and converts a high-level voltage of the gate control signal GCS into a gate high voltage VGH. The gate control signal GCS includes a start pulse, a gate output enable signal GOE and a shift clock.

The gate driver 300 supplies the scan signals SC to the gate lines GL in accordance with the gate control signal GCS supplied from the controller 200. The gate driver 300 may be disposed at one side or both sides of the display panel 100 in a gate in panel (GIP) manner. Alternatively, the gate driver 300 may be connected to the display panel 100 by a tape automated bonding (TAB) method, may be connected to the bonding pad of the display panel 100 by a chip on glass (COG) method or a chip on panel (COP) method, or may be connected to the display panel 100 by a chip on film (COF) method.

The gate driver 300 sequentially outputs the gate signals to the plurality of gate lines GL under the control of the controller 200. The gate driver 300 shifts the gate signal using a shift register to sequentially supply the signals to the gate lines GL.

The gate signal may include a scan signal SC and an emission control signal EM in the organic light emitting display device. The scan signal SC includes a scan pulse swinging between the gate-on voltage VGL and the gate-off voltage VGH.

The emission control signal EM may include an emission control signal pulse swinging between the gate-on voltage VEL and the gate-off voltage VEH.

The gate-on voltage is set to a voltage higher (e.g., greater) than the threshold voltage of the transistor. The gate-off voltage is set to a voltage lower (e.g., less) than the threshold voltage of the transistor. The transistor is turned on in response to the gate-on voltage and turned off in response to the gate-off voltage. In case of an n-channel transistor, the gate-on voltage may be a gate high voltage (VGH and VEH), and the gate-off voltage may be a gate low voltage (VGL and VEL). In case of a p-channel transistor, the gate-on voltage may be a gate low voltage (VGL and VEL), and the gate-off voltage may be a gate high voltage (VGH and VEH).

The scan pulse is synchronized with the data voltage Vdata to select the pixels P of a line in which the data is written. The emission control signal EM defines an emission time of the pixels P.

The gate driver 300 may include an emission control signal driver 310 and at least one or more scan drivers 320.

The emission control signal driver 310 outputs an emission control signal pulse in response to a start pulse and a shift clock from the controller 200 and sequentially shifts the emission control signal pulse in accordance with a shift clock.

At least one or more scan drivers 320 output the scan pulse in response to a start pulse and a shift clock from the controller 200 and shift a scan pulse in accordance with the shift clock timing.

The data driver 400 converts image data RGB input from the controller 200 into a data voltage Vdata in accordance with the data control signal DCS supplied from the controller 200 using a reference gamma voltage and supplies the converted data voltage Vdata to the pixel P through the data line DL.

Even though in FIG. 1, it is illustrated that one data driver 400 is disposed at one side (e.g., upper side) of the display panel 100, the number of the data drivers 400 and a placement position thereof are not limited thereto.

For example, the data driver 400 is configured by a plurality of integrated circuits (IC) to be disposed to be divided into a plurality of parts at one side of the display panel 100.

The power supply unit 500 generates a DC power required to drive the pixel array of the display panel 100 and the display panel driver using a DC-DC converter. The DC-DC converter may include a charge pump, a regulator, a buck converter, a boost converter, and the like. The power supply unit 500 receives a DC input voltage applied from the host system which is not illustrated to generate a DC voltage, such as a gate-on voltage VGL, VEL, a gate-off voltage VGH, VEH, a high potential driving voltage EVDD, and a low potential driving voltage EVSS. The gate-on voltage VGL, VEL and the gate-off voltage VGH, VEH are supplied to the level shifter which is not illustrated and the gate driver 300. The high potential driving voltage EVDD and the low potential driving voltage EVSS are commonly supplied to the pixels P.

Figure 2:
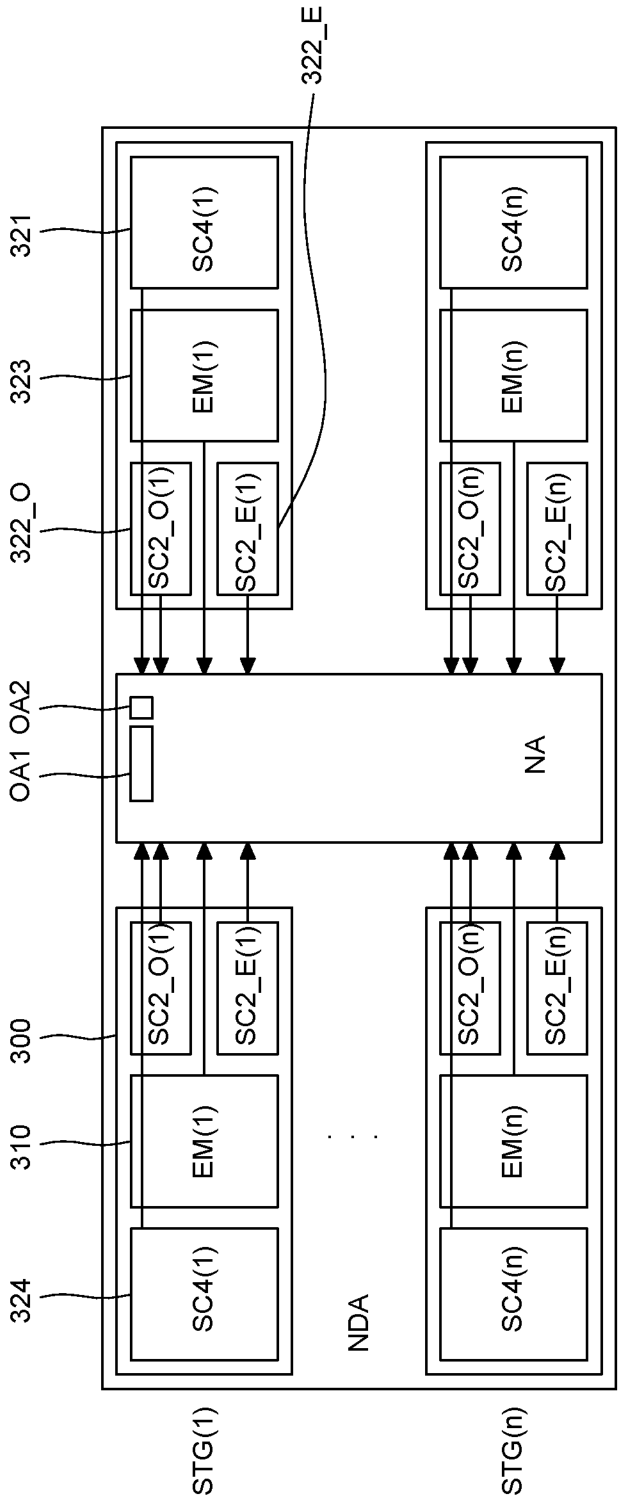
FIG. 2 is a view of a configuration of a gate driver in a display device according to an exemplary embodiment of the present disclosure.

FIG. 2 is a view of a configuration of a gate driver in a display device according to an exemplary embodiment of the present disclosure.

Referring to FIG. 2, the gate driver 300 is configured by an emission control signal driver 310 and a scan driver 320. The scan driver 320 may be configured by first to fourth scan drivers 321, 322, 323, and 324. Further, the second scan driver 322 may be provided as a plural (for example, two) and each be configured by an odd-numbered second scan driver 322_0 and an even-numbered second scan driver 322_E. The number of scan drivers is not limited to four, and can be any number as long as their functions are implemented.

In the gate driver 300, shift registers may be symmetrically disposed on both sides of the display area DA including left and right sides or upper and lower sides, but is not limited thereto. Alternatively, shift registers may be also configured unsymmetrically on both sides of the active area AA, or on one side thereof. Further, in the gate driver 300, a shift register at one side of the display area DA includes second scan drivers 322_0 and 322_E, a fourth scan driver 324, and an emission control signal driver 310. A shift register at the other side of the display area DA may be configured to include a first scan driver 321, second scan drivers 322_0 and 322_E, and a third scan driver 323. However, it is not limited thereto and the emission control signal driver 310 and the first to fourth scan drivers 321, 322, 323, and 324 may be disposed in different ways according to the exemplary embodiments.

Each of stages STG1 to STGn of the shift register may include a corresponding one of first scan signal generators SC1(1) to SC1(*n*), a corresponding one of second scan signal generators SC2_0(1) to SC2_0(*n*) and SC2_E(1) to SC2_E (n), a corresponding one of third scan signal generators SC3(1) to SC3(*n*), a corresponding one of fourth scan signal generators SC4(1) to SC4(*n*), and a corresponding one of emission control signal generators EM(1) to EM(n).

The first scan signal generators SC1(1) to SC1(*n*) output first scan signals SC1(1) to SC1(*n*) through a first scan line SCL1 of the display panel 100. The second scan signal generators SC2(1) to SC2(*n*) output second scan signals SC2(1) to SC2(*n*) through a second scan line SCL2 of the display panel 100. The third scan signal generators SC3(1) to SC3(*n*) output third scan signals SC3(1) to SC3(*n*) through a third scan line SCL3 of the display panel 100. The fourth scan signal generators SC4(1) to SC4(*n*) output fourth scan signals SC4(1) to SC4(*n*) through a fourth scan line SCL4 of the display panel 100. The emission control signal generators EM(1) to EM(n) output emission control signals EM(1) to EM(n) through emission control lines EML of the display panel 100.

The first scan signals SC1(1) to SC1(*n*) may be used as signals to drive an A-th transistor (for example, a compensation transistor) included in the pixel circuit. The second scan signals SC2(1) to SC2(*n*) may be used as signals to drive a B-th transistor (for example, a data supply transistor) included in the pixel circuit. The third scan signals SC3(1) to SC3(*n*) may be used as signals to drive a C-th transistor (for example, a bias transistor) included in the pixel circuit. The fourth scan signals SC4(1) to SC4(*n*) may be used as signals to drive a D-th transistor (for example, an initialization transistor) included in the pixel circuit. The emission control signals EM(1) to EM(n) may be used as signals to drive an E-th transistor (for example, an emission control transistor) included in the pixel circuit. For example, when the emission control transistors of pixels are controlled using emission control signals EM(1) to EM(n), an emission time of the light emitting diode is variable.

Referring to FIGS. 4A to 4D, in the display area DA, one or more optical areas OA1 and OA2 may be disposed.

One or more optical areas OA1 and OA2 may be disposed so as to overlap one or more optical electronic devices, such as an image capturing device such as a camera (image sensor) and a sensing sensor such as a proximity sensor and an illuminance sensor.

In one or more optical areas OA1 and OA2, a light transmitting structure is formed to have a predetermined level or higher of transmittance for an operation of an optical electronic device. As one method for increasing a transmittance of at least one of the first optical area OA1 and the second optical area OA2, a pixel density differential design method may be applied. According to the pixel density differential design method, the display panel 100 may be designed such that the number of pixels per unit area of at least one of the first optical area OA1 and the second optical area OA2 is smaller than the number of pixels per unit area of the normal area NA.

In the meantime, in some cases, in contrast, as another method for increasing a transmittance of at least one of the first optical area OA1 and the second optical area OA2, a pixel size differential design method may be applied. According to the pixel size differential design method, the display panel 100 may be designed such that the number of pixels per unit area of at least one of the first optical area OA1 and the second optical area OA2 is equal to or similar to the number of pixels per unit area of the normal area NA. However, the size (that is, an emission area size) of each pixel P disposed in at least one of the first optical area OA1 and the second optical area OA2 is smaller than the size (that is, an emission area size) of each pixel P disposed in the normal area NA.

Hereinafter, for the convenience of description, it is assumed that the pixel density differential design method, between two methods (the pixel density differential design method and the pixel size differential design method) for increasing a transmittance of at least one of the first optical area OA1 and the second optical area OA2, is applied. For example, the number of pixels P per unit area in one or more optical areas OA1 and OA2 may be smaller than the number of pixels P per unit area in a normal area excluding the optical areas OA1 and OA2 in the display area DA. For example, the resolution of one or more optical areas OA1 and OA2 may be lower than a resolution of a normal area in the display area DA.

A light transmission structure in one or more optical areas OA1 and OA2 may be configured by patterning the cathode electrode in a part in which the pixel P is not disposed. At this time, the cathode electrode to be patterned may be removed using laser or the cathode electrode is selectively formed to be patterned using a material such as a cathode deposition stop layer.

Further, in one or more optical areas OA1 and OA2, the light transmission structure may be configured by separately forming the light emitting diode ED and the pixel circuit in the pixel P. In other words, the light emitting diode ED of the pixel P is located on the optical areas OA1 and OA2 and the plurality of transistors TFT which configures the pixel circuit is disposed in the vicinity of the optical areas OA1 and OA2. Therefore, the light emitting diode ED and the pixel circuit may be electrically connected by means of a transparent metal layer.

Further, some of one or more optical areas OA1 and OA2 are formed on the substrate as a hole or a notch so that the pixel P may not be disposed.

FIG. 3 is an equivalent circuit diagram of a pixel in a display panel according to exemplary embodiments of the present disclosure.

FIG. 3 illustrates the pixel circuit for description and it is not specifically limited as long as the structure can control the emission of the light emitting diode ED by applying the emission signal EM(n). For example, the pixel circuit may include an additional scan signal, a switching thin film transistor connected thereto, and a switching thin film transistor to which an additional initialization voltage is applied. Further, a connection relationship of a switching element and a connection location of a capacitor may be disposed in various manners. Hereinafter, for the convenience of description, a display device with a pixel circuit structure of FIG. 3 will be described.

Referring to FIG. 3, each of the plurality of pixels P may include a pixel circuit having a driving transistor DT and a light emitting diode ED connected to the pixel circuit.

The pixel circuit controls the driving current which flows in the light emitting diode ED to drive the light emitting diode ED. The pixel circuit may include the driving transistor DT, first to seventh transistors T1 to T7, and the capacitor Cst, which is called a 7T1C structure. The structure of the pixel circuit is not limited to 7T1C, for example, a number of transistors which function as driving element and switch elements, in the pixel circuit of the present disclosure may be seven or more, and a number of capacitors may be one or more. For example, 3T1C, 4T1C, 5T1C, 3T2C, 4T2C, 5T2C, 6T2C, 7T1C, 7T2C, 8T2C structures, etc. are also possible. And more or less transistors and capacitors could be included. Each of the transistors DT, T1 to T7 may include a first electrode, a second electrode, and a gate electrode. One of the first electrode and the second electrode may be a source electrode and the other one of the first electrode and the second electrode may be a drain electrode.

Each of the transistors DT, T1 to T7 may be a P-type thin film transistor or an N-type thin film transistor. In the exemplary embodiment of FIG. 3, the first transistor T1 and the seventh transistor T7 are N-type thin film transistors and the remaining transistors DT, T2 to T6 are P-type thin film transistors. However, it is not limited thereto and depending on the exemplary embodiment, all or some of the transistors DT, T1 to T7 may be P-type thin film transistors or N-type thin film transistors. Further, the N-type thin film transistor may be an oxide thin film transistor and the P-type thin film transistor may be a polycrystalline silicon thin film transistor. Alternatively, the N type thin film transistor may be a polysilicon thin film transistor, and the P type thin film transistor may be an oxide thin film transistor.

Hereinafter, it is exemplified that the first transistor T1 and the seventh transistor T7 are N-type thin film transistors and the remaining transistors DT, T2 to T6 are P-type thin film transistors. Accordingly, a high voltage is applied to the first transistor T1 and the seventh transistor T7 to be turned on and a low voltage is applied to the remaining transistors DT, T2 to T6 to be turned on.

According to the exemplary embodiment, the first transistor T1 which configures the pixel circuit may serve as a compensation transistor, the second transistor T2 may serve as a data supply transistor, the third and fourth transistors T3 and T4 may serve as emission control transistors, and the fifth transistor T5 may serve as a bias transistor. Further, the sixth and seventh transistors T6 and T7 may serve as initialization transistors.

The light emitting diode ED may include an anode electrode and a cathode electrode. The anode electrode of the light emitting diode ED may be connected to a fifth node N5 and the cathode may be connected to a low potential driving voltage EVSS.

The driving transistor DT may include a first electrode connected to a second node N2, a second electrode connected to a third node N3, and a gate electrode connected to a first node N1. The driving transistor DT may provide a driving current Id to the light emitting diode ED based on a voltage of the first node N1 (or a data voltage stored in the capacitor Cst to be described below).

The first transistor T1 may include a first electrode connected to the first node N1, a second electrode connected to the third node N3, and a gate electrode which receives a first scan signal SC1(n). The first transistor T1 is turned on in response to the first scan signal SC1(n) and is diode-connected between the first node N1 and the third node N3 to sample a threshold voltage Vth of the driving transistor DT. Such a first transistor T1 may be a compensation transistor.

The capacitor Cst may be connected or formed between the first node N1 and a fourth node N4. The capacitor Cst may store or maintain the supplied high potential driving voltage EVDD.

The second transistor T2 may include a first electrode which is connected to a data line DL (or receives a data voltage Vdata), a second electrode connected to the second node N2, and a gate electrode which receives a second scan signal SC2(n). The second transistor T2 is turned on in response to a second scan signal SC2(n) and may transmit the data voltage Vdata to the second node N2. Such a second transistor T2 may be a data supply transistor.

The third transistor T3 and the fourth transistor T4 (or first and second emission control transistors) are connected between the high potential driving voltage EVDD and the light emitting diodes ED and may form a current flowing path through which the driving current ID generated by the driving transistor DT flows.

The third transistor T3 may include a first electrode which is connected to the fourth node N4 to receive a high potential driving voltage EVDD, a second electrode connected to the second node N2, and a gate electrode which receives an emission control signal EM(n).

The fourth transistor T4 may include a first electrode connected to the third node N3, a second electrode connected to the fifth node N5 (or the anode electrode of the light emitting diode ED), and a gate electrode which receives the emission control signal EM(n).

The third and fourth transistors T3 and T4 are turned on in response to the emission control signal EM(n) and in this case, the driving current Id is supplied to the light emitting diode ED and the light emitting diode ED may emit light with a luminance corresponding to the driving current Id.

The fifth transistor T5 may include a first electrode which receives a bias voltage Vobs, a second electrode connected to the second node N2, and a gate electrode which receives a third scan signal SC3(n). Such a fifth transistor T5 may be a bias transistor.

The sixth transistor T6 may include a first electrode which receives a first initialization voltage Var, a second electrode connected to the fifth node N5, and a gate electrode which receives the third scan signal SC3(n).

The sixth transistor T6 is turned on in response to the third scan signal SC3(n), before the light emitting diode ED emits light (or after the light emitting diode ED emits light) and may initialize the anode electrode (or the pixel electrode) of the light emitting diode ED using the first initialization voltage Var. The light emitting diode ED may have a parasitic capacitor formed between the anode electrode and the cathode electrode. The parasitic capacitor is charged while the light emitting diode ED emits light so that the anode electrode of the light emitting diode ED may have a specific voltage. Accordingly, the first initialization voltage Var is applied to the anode electrode of the light emitting diode ED through the sixth transistor T6 to initialize a quantity of charges accumulated in the light emitting diode ED.

In the present disclosure, the gate electrodes of the fifth and sixth transistors T5 and T6 are configured to commonly receive the third scan signal SC3(n). However, the present disclosure is not essentially limited thereto and the gate electrodes of the fifth and sixth transistors T5 and T6 may be configured to receive separate scan signals to be independently controlled.

The seventh transistor T7 may include a first electrode which receives a second initialization voltage Vini, a second electrode connected to the first node N1, and a gate electrode which receives a fourth scan signal SC4(n).

The seventh transistor T7 is turned on in response to the fourth scan signal SC4(n) and may initialize the gate electrode of the driving transistor DT using the second initialization voltage Vini. In the gate electrode of the driving transistor DT, unnecessary charges may remain due to the high potential driving voltage EVDD stored in the capacitor Cst. Accordingly, the second initialization voltage Vini is applied to the gate electrode of the driving transistor DT through the seventh transistor T7 to initialize the remaining quantity of charges.

FIGS. 4A to 4E are schematic plan views of a display device according to an exemplary embodiment of the present disclosure.

Referring to FIGS. 4A to 4E, a display device 10 according to an exemplary embodiment of the present disclosure may include a display panel 100 which displays images and one or more optical electronic devices 11 and 12. The optical electronic devices 11 and 12 may include a light receiving device which receives light, such as a camera or a sensor.

The display panel 100 is a panel for displaying images to a user.

The display panel 100 may include a display element which displays images, a driving element which drives the display element, lines which transmit various signals to the display element and the driving element, and the like. The display element may be defined in different ways depending on a type of the display panel 100. For example, when the display panel 100 is an organic light emitting display panel, the display element may be an organic light emitting diode which includes an anode electrode, an emission layer, and a cathode electrode. For example, when the display panel 100 is a liquid crystal display panel, the display element may be a liquid crystal display element. Further, the display device 10 according to the exemplary embodiment of the present disclosure may be a flexible organic light emitting display device. Hereinafter, even though the display panel 100 is assumed as an organic light emitting display panel, the display panel 100 is not limited to the organic light emitting display panel.

In the meantime, the display panel 100 may be configured to include a substrate, a plurality of insulating films, a transistor layer, and a light emitting diode layer on the substrate. The display panel 100 may include a plurality of pixels for displaying images and various signal lines for driving the plurality of pixels. The signal lines may include a plurality of data lines, a plurality of gate lines, a plurality of power lines, and the like. At this time, each of the plurality of pixels may include a transistor located on the transistor layer and a light emitting diode located on the light emitting diode layer.

The display panel 100 may include a display area DA in which images are displayed and a non-display area NDA in which no image is displayed.

In the display area DA, a plurality of pixels and a circuit for driving the plurality of pixels may be disposed. The plurality of pixels is a minimum unit which configures the display area DA and a display element may be disposed in each of the plurality of pixels. For example, an organic light emitting diode which includes an anode electrode, an emission layer, and a cathode electrode may be disposed in each of the plurality of pixels, but it is not limited thereto. Further, a circuit for driving the plurality of pixels may include a driving element, a line, and the like. For example, the circuit may be configured by a thin film transistor, a storage capacitor, a gate line, a data line, and the like, but is not limited thereto.

The non-display area NDA is an area where no image is displayed. The non-display area NDA is bent so as not to be seen from a front surface or blocked by a case (not illustrated) and is also referred to as a bezel area.

Even though in FIGS. 4A to 4E, it is illustrated that the non-display area NDA encloses a quadrangular display area DA, shapes and placements of the display area DA and the non-display area NDA are not limited to the example illustrated in FIGS. 4A to 4E. That is, the display area DA and the non-display area NDA may have shapes suitable for a design of an electronic device including the display device 10. For example, an exemplary shape of the display area DA may be a pentagon, a hexagon, a circle, an oval, or the like.

In the non-display area NDA, various lines, circuits, and the like for driving the organic light emitting diode of the display area DA may be disposed. For example, in the non-display area NDA, a link line which transmits signals to the plurality of sub pixels and circuits of the display area DA, a gate-in-panel (GIP) line, a ground line (GND, GRD), a driving IC, such as a gate driver IC or a data driver IC, or the like, may be disposed, but it is not limited thereto.

For example, in the non-display area NDA, a ground line GND which is disposed to enclose the display area DA and applies a common voltage to the pixel may be included. For example, one or two or more ground lines GND may be formed. When two or more ground lines GND are formed, the ground line located closer to the display area DA may be referred to as an internal ground line GRD.

Further, even though it is not illustrated, the display device 10 may include a touch sensing unit including a plurality of touch electrodes. In the plurality of touch electrodes, a touch routing line TL which transmits a touch signal may be disposed.

The display device 10 may further include various additional elements to generate various signals or drive the pixel in the display area DA. The additional elements for driving the pixels may include an inverter circuit, a multiplexer, an electrostatic discharge (ESD) circuit, or the like. The display device 10 may further include an additional element associated with a function other than a pixel driving function. For example, the display device 10 may include additional elements which provide a touch sensing function, a user authentication function (for example, fingerprint recognition), a multilevel pressure sensing function, a tactile feedback function, or the like. The above-mentioned additional elements may be located in an external circuit which is connected to the non-display area NDA and/or the connecting interface.

For example, in the non-display area NDA of the display device 10, a pad area may be included. In the pad area, pads which are connected to various signal lines and printed circuit boards are disposed. For example, in the non-display area NDA, a bending area may be further included between the display area DA and the pad area. The bending area is bent so that the pad area may be disposed behind the display panel 100, but is not limited thereto.

The pad area may include an integrated circuit bonding pad area COP which is disposed in the non-display area NDA and is bonded with a driver integrated circuit DIC and a film bonding pad area FOP which is disposed in the non-display area NDA and is bonded with a flexible printed circuit. At this time, the integrated circuit bonding pad area COP may be located closer to the display area DA, than the film bonding pad area FOP, but is not limited thereto.

Referring to FIGS. 4A to 4E, in the display device 10 according to the exemplary embodiments of the present disclosure, one or more optical electronic devices 11 and 12 may be electronic components located below the display panel 100 (an opposite side to a viewing surface).

Light enters the front surface (viewing surface) of the display panel 100 and passes through the display panel 100 to be transmitted to one or more optical electronic devices 11 and 12 located below of the display panel 100 (an opposite side to a viewing surface).

One or more optical electronic devices 11 and 12 may be devices which receive light which passes through the display panel 100 to perform a predetermined function according to received light. For example, the optical electronic devices 11 and 12 may include one or more of an image capturing device such as a camera (image sensor) and a sensing sensor such as an illumination sensor and a proximity sensor.

As described above, the optical electronic devices 11 and 12 are devices which require light reception, but may be disposed below the display panel 100. That is, the optical electronic devices 11 and 12 may be disposed in an opposite side to a viewing surface of the display panel 100. The optical electronic devices 11 and 12 are not exposed to the front surface of the flexible display device 10. Accordingly, when a user views a front surface of the flexible display device 10, the optical electronic devices 11 and 12 are not seen.

For example, a camera which is located below the display panel 100 is a front side camera which captures the front surface and may also be considered as a camera lens.

Referring to FIGS. 4A to 4E, in the display device 10 according to the exemplary embodiments of the present disclosure, the display area DA may include a first display area including one or more optical areas OA1 and OA2 and a second display area which is a normal area NA enclosing the first display area.

One or more optical areas OA1 and OA2 may be areas overlapping one or more optical electronic devices 11 and 12.

Figure 4A:
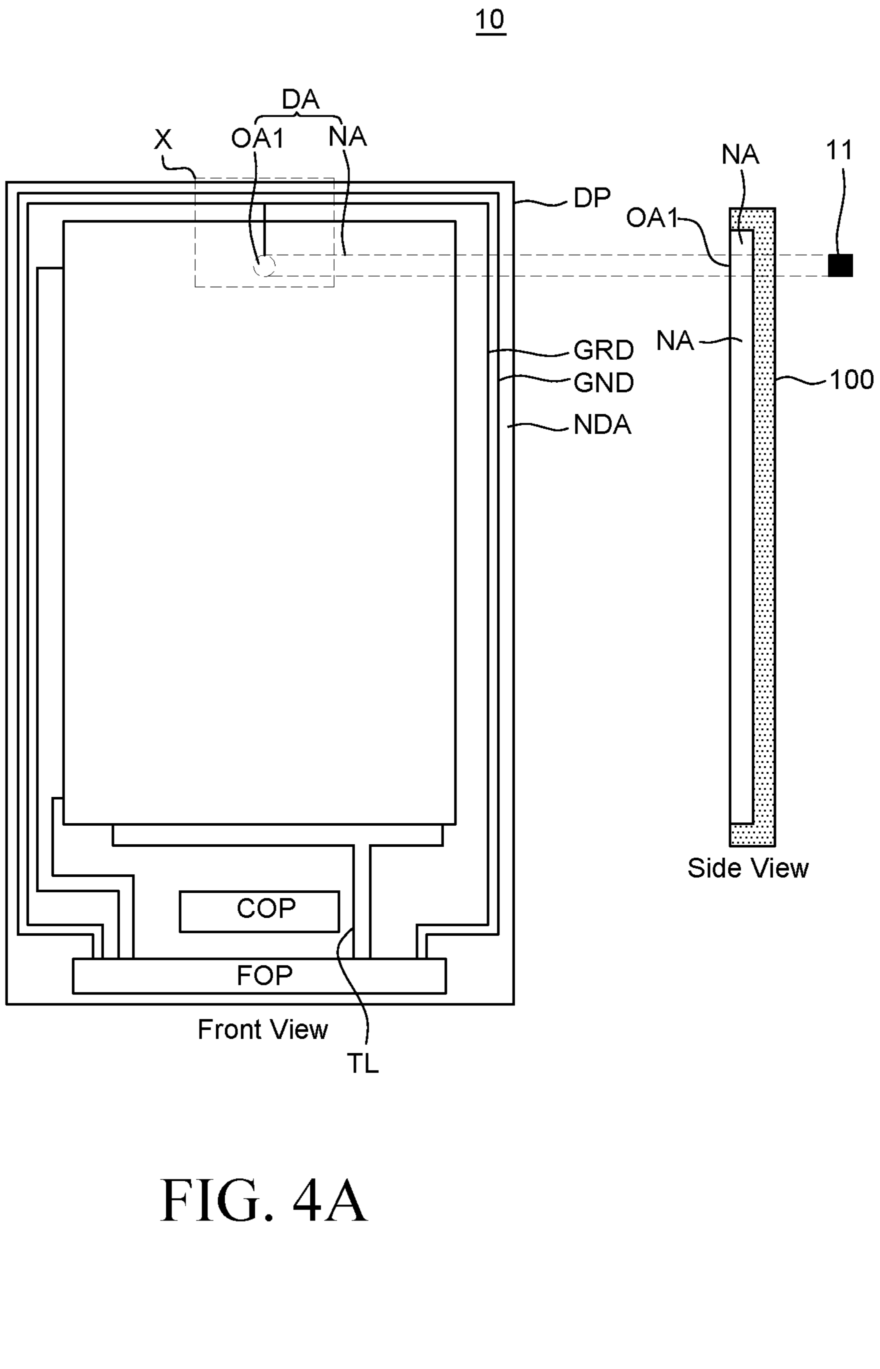
FIGS. 4A to 4E are schematic plan views of a display device according to an exemplary embodiment of the present disclosure.

According to an example of FIG. 4A, the display area DA may include a normal area NA and a first optical area OA1. Here, at least a part of the first optical area OA1 may overlap a first optical electronic device 11.

Figure 4B:
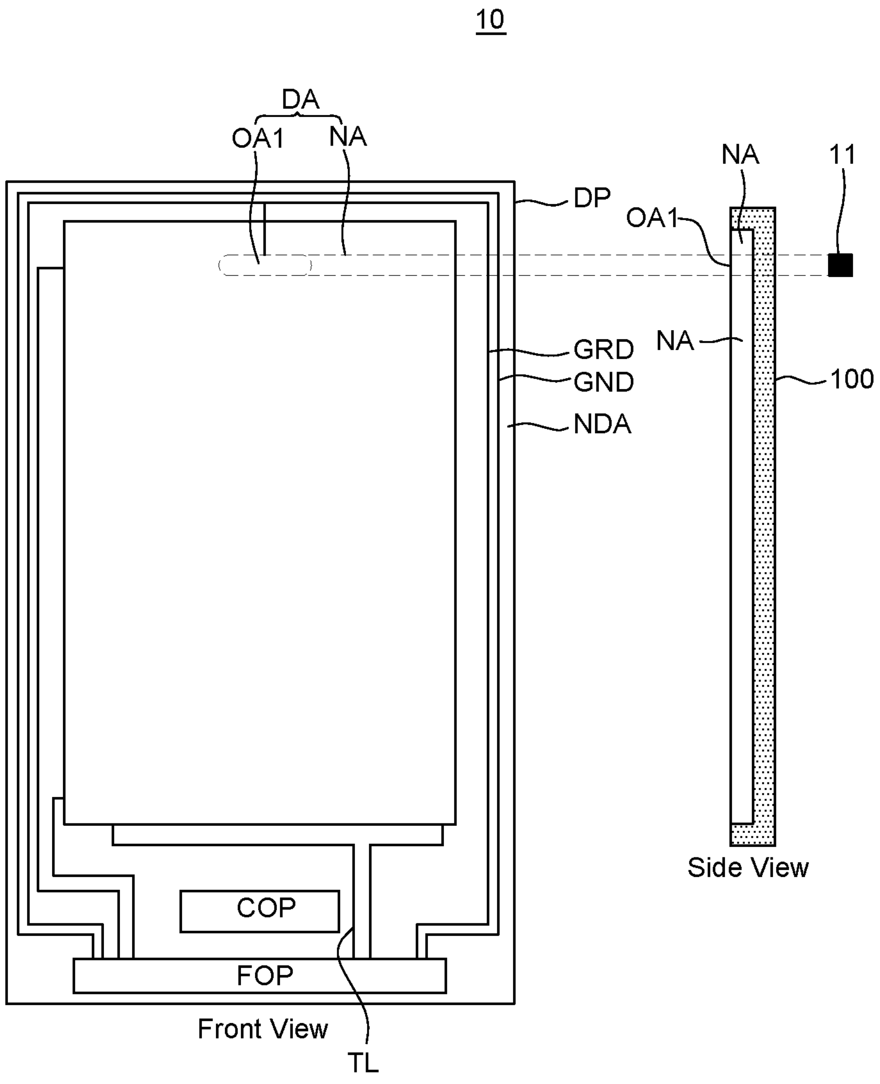

Even though in FIG. 4A, a circular structure of the first optical area OA1 is illustrated, a shape of the first optical area OA1 according to the exemplary embodiment of the present disclosure is not limited thereto. For example, as illustrated in FIG. 4B, the first optical area OA1 may have an octagonal shape, and also may be formed of various polygonal shapes.

Figure 4C:
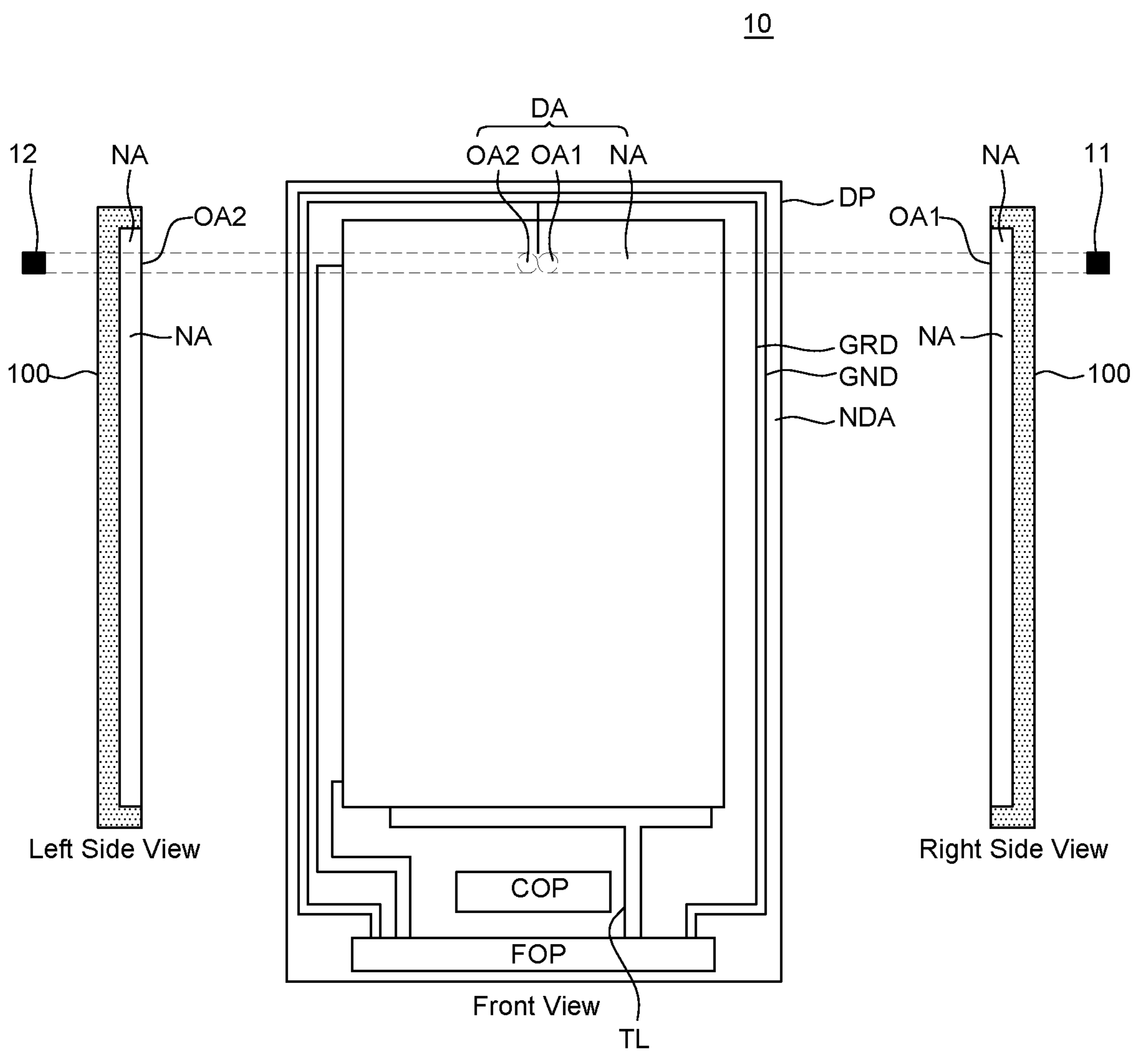

According to an example of FIG. 4C, the display area DA may include a normal area NA, a first optical area OA1, and a second optical area OA2. In an example of FIG. 4C, the normal area NA may be disposed between the first optical area OA1 and the second optical area OA2. Here, at least a part of the first optical area OA1 may overlap the first optical electronic device 11 and at least a part of the second optical area OA2 may overlap the second optical electronic device 12.

Figure 4D:
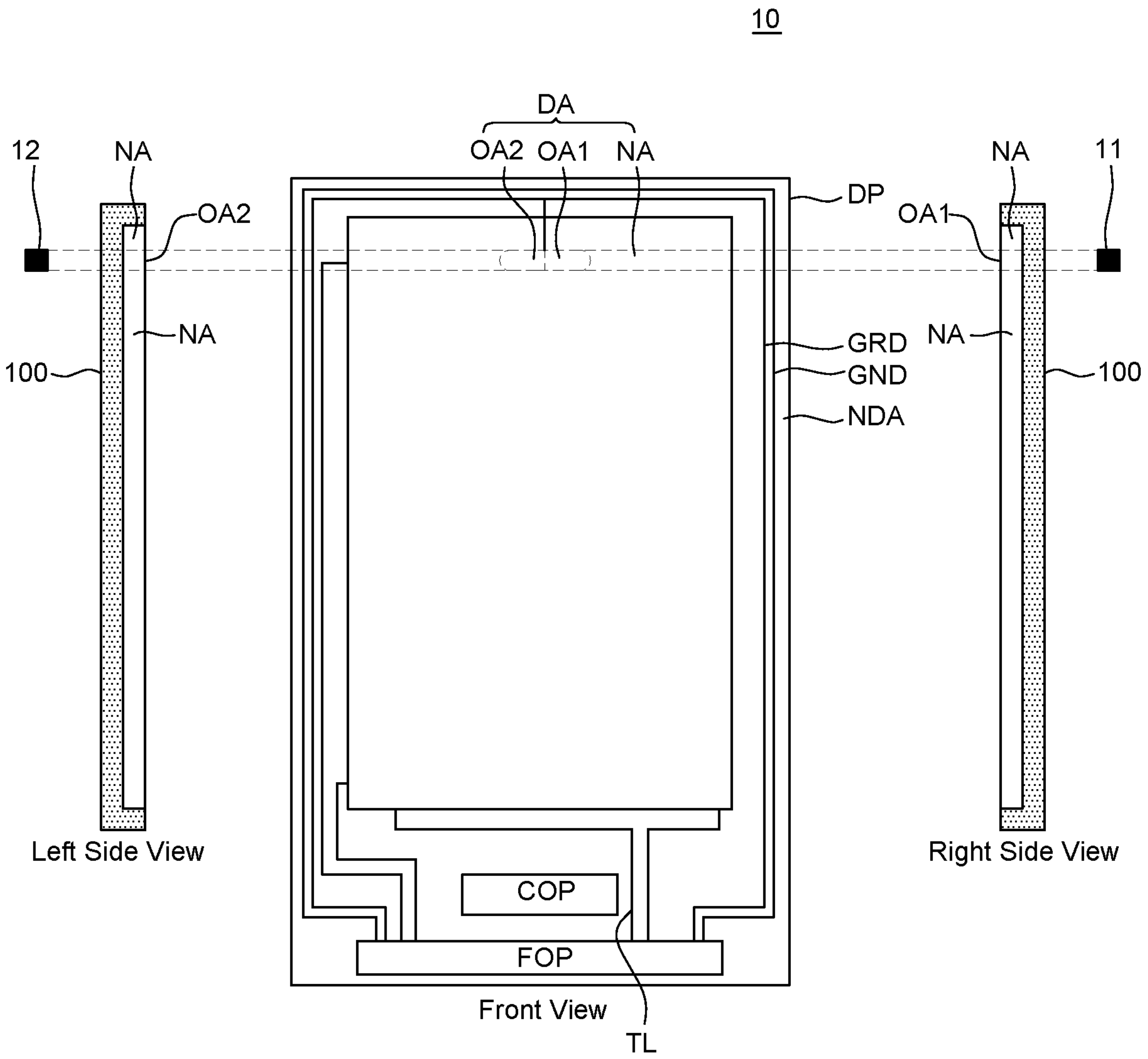

According to an example of FIG. 4D, the display area DA may include a normal area NA, a first optical area OA1, and a second optical area OA2. In an example of FIG. 4D, the normal area NA is not disposed between the first optical area OA1 and the second optical area OA2. That is, the first optical area OA1 and the second optical area OA2 may be in contact with each other. Here, at least a part of the first optical area OA1 may overlap the first optical electronic device 11 and at least a part of the second optical area OA2 may overlap the second optical electronic device 12.

One or more optical electronic devices 11 and 12 are devices which need to receive light, but are located behind the display panel 100 (or below, an opposite side of a viewing surface) to receive light which passes through the display panel 100.

For example, the first optical electronic device 11 may be a camera and the second optical electronic device 12 may be a sensing sensor such as a proximity sensor or an illumination sensor. For example, the sensing sensor may be an infrared sensor which senses an infrared ray. In contrast, the first optical electronic device 11 may be a sensing sensor and the second electronic device 12 may be a camera, but is not limited thereto, for example, the first optical electronic device 11 and the second electronic device 12 may be other device in addition to camera and sensing sensor.

Hereinafter, for the convenience of description, an example that the first optical electronic device 11 is a camera and the second optical electronic device 12 is a sensing sensor will be described. Here, the camera may be a camera lens or an image sensor.

When the first optical electronic device 11 is a camera, the camera may be a front side camera which is located behind (or below) the display panel 100, but captures a front direction of the display panel 100. Accordingly, the user may take a picture through a camera while watching the viewing surface of the display panel 100.

In the normal area NA and one or more optical areas OA1 and OA2 included in the display area DA, the normal area NA is an area in which there is no need to form a light transmission structure and one or more optical areas OA1 and OA2 are areas in which the light transmission structure needs to be formed. Accordingly, one or more optical areas OA1 and OA2 need to have a predetermined level or higher of transmittance and the normal area NA may not have light transmissivity or have a transmittance lower than a predetermined level.

For example, one or more optical areas OA1 and OA2 and the normal area NA may have different areas, different shapes, different resolutions, sub pixel placement structures, numbers of sub pixels for every unit area, electrode structures, line structures, electrode placement structures, line placement structures, or the like.

The first optical area OA1 may have various shapes such as a square, an elliptic, a diamond, a circle, an oval, a rectangle, a hexagon, or an octagon. The second optical area OA2 may have various shapes such as a square, an elliptic, a diamond, a circle, an oval, a rectangle, a hexagon, or an octagon. The first optical area OA1 and the second optical area OA2 may have the same shape or different shapes. When the first optical area OA1 and the second optical area OA2 are in contact with each other, the entire optical area including the first optical area OA1 and the second optical area OA2 may have various shapes, such as a square, an elliptic, a diamond, a circle, an oval, a rectangle, a hexagon, or an octagon. Hereinafter, for the convenience of description, an example that the first optical area OA1 and the second optical area OA2 are circles will be described.

In the display device 10 according to the exemplary embodiment of the present disclosure, when the first and second optical electronic devices 11 and 12 which are not exposed to the outside and are hidden below the display panel 100 are cameras, the display device 10 according to the exemplary embodiment of FIGS. 4A to 4D may be a display device to which a under display camera (UDC) technique is applied. Further, the display device 10 according to the exemplary embodiment of FIG. 4E may be a display device to which a hole in active area (HiAA) technique is applied.

In the exemplary embodiment of FIGS. 4A to 4D in which UDC technique is applied, in the display device 10 according to the exemplary embodiment of the present disclosure, there is no need to form a notch or a camera hole for exposing the camera in the display panel 100, so that the area of the display area DA is not reduced. Accordingly, there is no need to form a notch or a camera hole for exposing the camera in the display panel 100 so that a size of the bezel area may be reduced and design constraints are not provided to increase a degree of freedom of design.

In the exemplary embodiment of FIGS. 4A to 4D, even though one or more optical electronic devices 11 and 12 are hidden behind the display panel 100, one or more optical electronic devices 11 and 12 normally receive light to normally perform a determined function. Further, even though one or more optical electronic devices 11 and 12 are hidden behind the display panel 100 and overlap the display area DA, in one or more optical areas OA1 and OA2 overlapping one or more optical electronic devices 11 and 12 in the display area DA, the image needs to be normally displayed.

For example, in one or more optical areas OA1 and OA2, both an image display structure and a light transmission structure need to be formed. For example, one or more optical areas OA1 and OA2 are a partial area of the display area DA so that in one or more optical areas OA1 and OA2, a pixel for displaying images needs to be disposed. Further, a light transmission structure to transmit light to one or more optical electronic devices 11 and 12 needs to be formed. At this time, one or more optical electronic devices 11 and 12 are not exposed onto the front surface (the viewing surface) of the display panel 100. Accordingly, when a user views a front surface of the display device 10, the optical electronic devices 11 and 12 are not seen to the user.

Further, the normal area NA and one or more optical areas OA1 and OA2 may have different resolutions. For example, the number of pixels for every unit area in one or more optical areas OA1 and OA2 may be smaller than the number of pixels for every unit area in the normal area NA. For example, the resolution of one or more optical areas OA1 and OA2 may be lower than a resolution of a normal area NA. At this time, the number of pixels for every unit area is a unit of measuring a resolution and may be also pixels per inch (PPI) indicating the number of pixels within one inch. For example, the number of pixels for every unit area in the first optical area OA1 may be smaller than the number of pixels for every unit area in the normal area NA. The number of pixels for every unit area in the second optical area OA2 may be equal to or larger than the number of pixels for every unit area in the first optical area OA1.

Figure 4E:
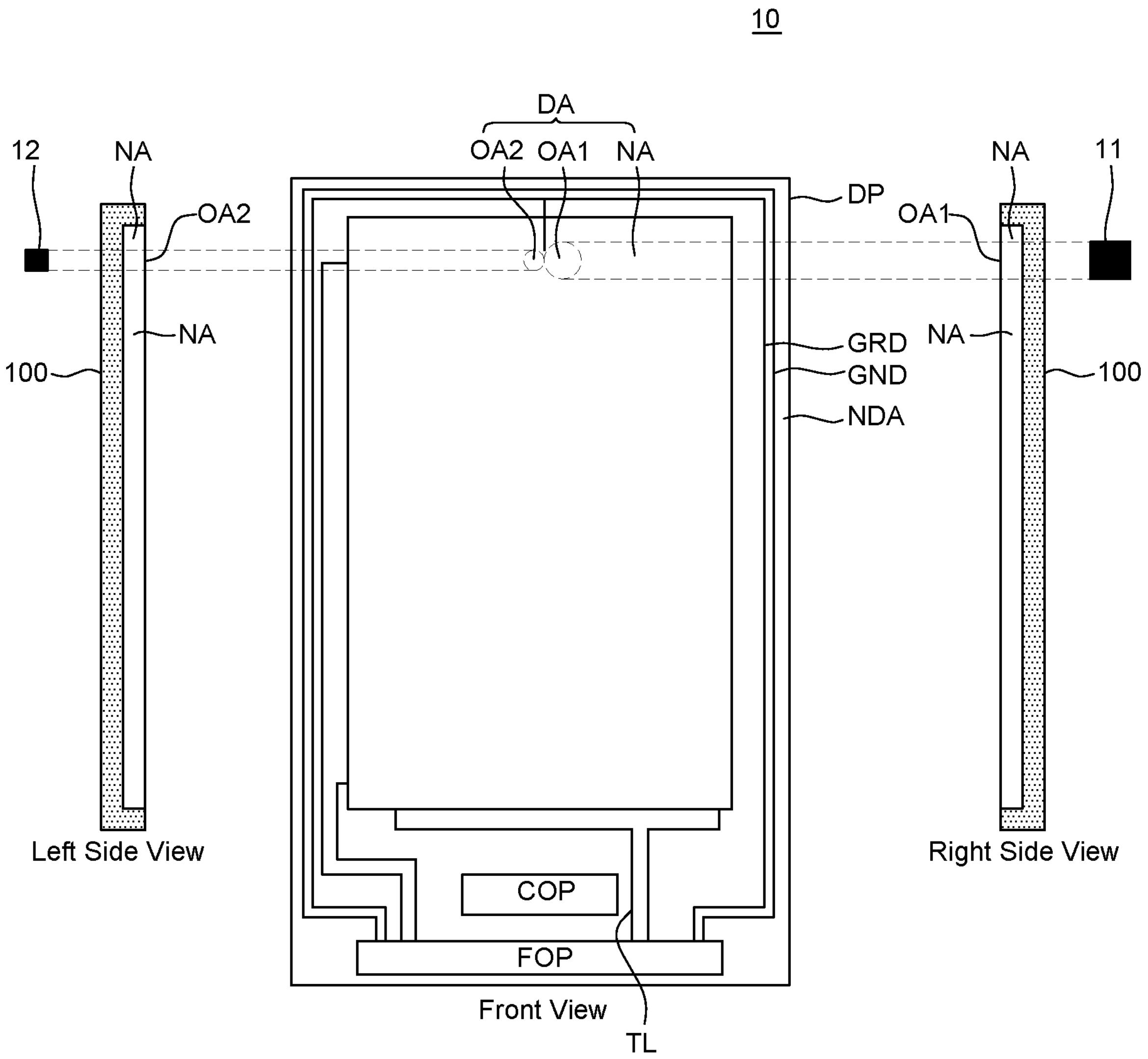

In the exemplary embodiment of FIG. 4E in which the HiAAL technique is applied, the first optical area OA1 may be formed as a notch or a camera hole to expose the camera. In this case, the first optical area OA1 is a notch or a camera hole, so that the first optical area OA1 may be formed to be larger than the second optical area OA2. The display panel 100 to which the under display camera (UDC) technique of the exemplary embodiment of FIGS. 4A to 4D is applied will be described with reference to FIG. 5 and the first optical area OA1 which is formed as a camera hole type which is the exemplary embodiment of FIG. 4E will be described in detail in FIG. 8.

As described above, the display device 10 according to the exemplary embodiment of the present disclosure may have a structure which improves a transmittance of the first optical area OA1 and the second optical area OA2 overlapping the optical electronic devices 11 and 12.

Figure 5:
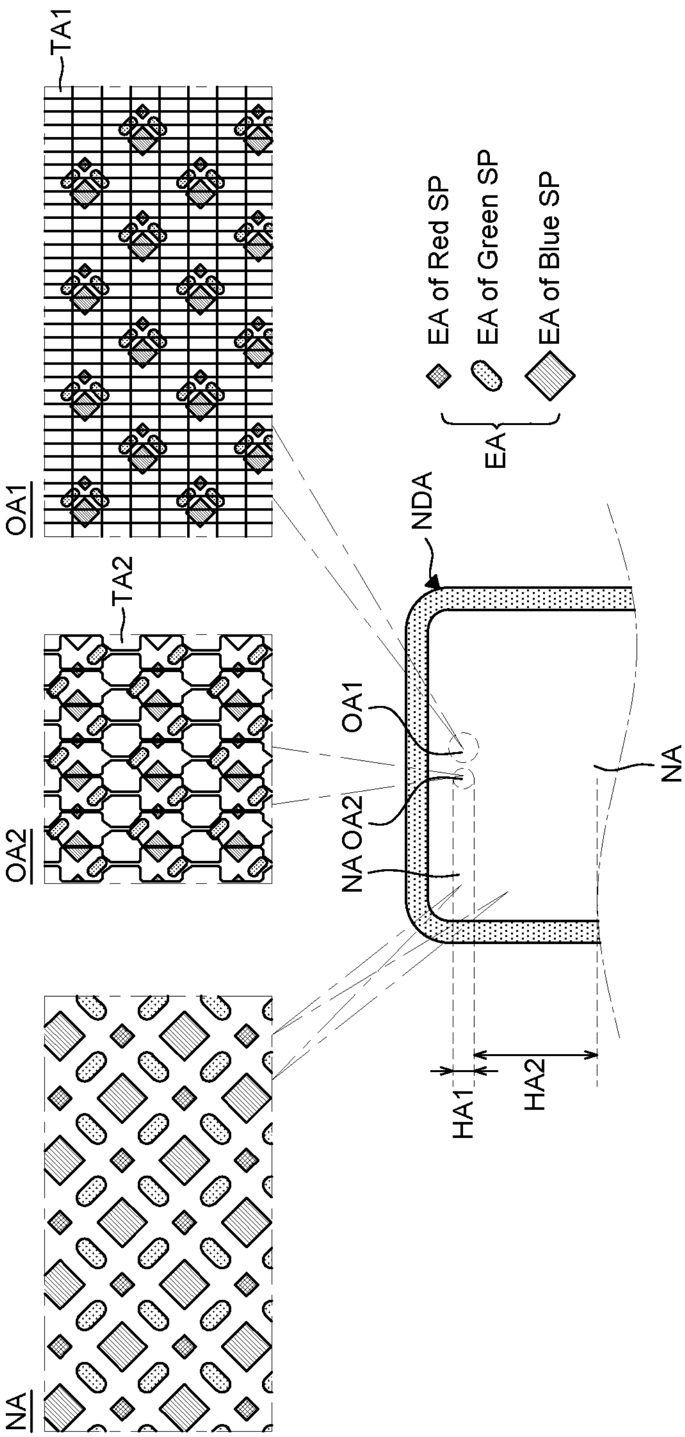
FIG. 5 is a view illustrating a placement of sub pixels in a normal area, a first optical area, and a second optical area, in a display device according to an exemplary embodiment of the present disclosure.

FIG. 5 is a view illustrating a placement of pixels in a normal area, a first optical area, and a second optical area, in a display device according to an exemplary embodiment of the present disclosure.

Referring to FIG. 5, in the normal area NA, the first optical area OA1, and the second optical area OA2 included in the display area DA, a plurality of pixels P may be disposed.

For example, the plurality of pixels P may include a red sub pixel Red SP which emits red light, a green sub pixel Green SP which emits green light, and a blue sub pixel Blue SP which emits blue light. Herein, red, green and blue in RGB color system are listed as an example. Needless to say, other color systems such as CMYK may be adopted.

Therefore, each of the normal area NA, the first optical area OA1, and the second optical area OA2 may include emission areas EA of the red sub pixels Red SP, emission areas EA of the green sub pixels Green SP, and emission areas EA of the blue sub pixels Blue SP.

Referring to FIG. 5, the normal area NA does not include a light transmission structure, but may include an emission area EA.

However, the first optical area OA1 and the second optical area OA2 need to include not only the emission areas EA, but also the light transmission structure.

Accordingly, the first optical area OA1 may include the emission areas EA and first transmission areas TA1 and the second optical area OA2 may include the emission areas EA and second transmission areas TA2.

The emission areas EA and the transmission areas TA1 and TA2 may be distinguished depending on whether to transmit light. For example, the emission areas EA may be areas through which the light cannot be transmitted and the transmission areas TA1 and TA2 may be areas through which the light can be transmitted.

Further, the emission areas EA and the transmission areas TA1 and TA2 may be distinguished depending on whether to form a specific metal layer. For example, in the emission areas EA, the cathode electrode CE may be formed and in the transmission areas TA1 and TA2, the cathode electrode CE may not be formed. Light shield layers may be formed on the emission areas EA and a light shield layer may not be formed in the transmission areas TA1 and TA2.

The first optical area OA1 includes first transmission areas TA1 and the second optical area OA2 includes second transmission areas TA2 so that both the first optical area OA1 and the second optical area OA2 are areas through which light can pass.

A transmittance (a degree of transmission) of the first optical area OA1 and a transmittance (a degree of transmission) of the second optical area OA2 may be equal.

In this case, the first transmission area TA1 of the first optical area OA1 and the second transmission area TA2 of the second optical area OA2 may have the same shape or same size. Alternatively, even though the first transmission area TA1 of the first optical area OA1 and the second transmission area TA2 of the second optical area OA2 have different shapes or sizes, a rate of the first transmission area TA1 in the first optical area OA1 and a rate of the second transmission area TA2 in the second optical area OA2 may be equal.

In contrast, a transmittance (a degree of transmission) of the first optical area OA1 and a transmittance (a degree of transmission) of the second optical area OA2 may be different from each other.

In this case, the first transmission area TA1 of the first optical area OA1 and the second transmission area TA2 of the second optical area OA2 may have different shapes or sizes. Alternatively, even though the first transmission area TA1 of the first optical area OA1 and the second transmission area TA2 of the second optical area OA2 have the same shape or size, a rate of the first transmission area TA1 in the first optical area OA1 and a rate of the second transmission area TA2 in the second optical area OA2 may be different.

For example, when the first optical electronic device 11 which overlaps the first optical area OA1 is a camera and the second optical electronic device 12 which overlaps the second optical area OA2 is a sensing sensor, the camera may require more amount of light than the sensing sensor.

Accordingly, the transmittance (a degree of transmission) of the first optical area OA1 may be higher than the transmittance (a degree of transmission) of the second optical area OA2.

In this case, the size of the first transmission area TA1 of the first optical area OA1 may be larger than the size of the second transmission area TA2 of the second optical area OA2. Alternatively, even though the first transmission area TA1 of the first optical area OA1 and the second transmission area TA2 of the second optical area OA2 have the same shape or size, a rate of the first transmission area TA1 in the first optical area OA1 may be higher than a rate of the second transmission area TA2 in the second optical area OA2.

Hereinafter, for the convenience of description, an example that the transmittance (a degree of transmission) of the first optical area OA1 is higher than the transmittance (a degree of transmission) of the second optical area OA2 will be described.

Further, as illustrated in FIG. 5, in the exemplary embodiments of the present disclosure, the transmission areas TA1 and TA2 may also be referred to as transparent areas and the transmittance may also be referred to as a transparency.

Further, as illustrated in FIG. 5, in the exemplary embodiments of the present disclosure, it is assumed that the first optical area OA1 and the second optical area OA2 are located in an upper end of the display area DA of the display panel 100 and are horizontally parallel to each other. However, the present disclosure is not limited thereto and the first optical area OA1 and the second optical area OA2 may be disposed in different positions.

Referring to FIG. 5, a horizontal display area in which the first optical area OA1 and the second optical area OA2 are disposed is referred to as a first horizontal display area HA1. Further, a horizontal display area in which the first optical area OA1 and the second optical area OA2 are not disposed is referred to as a second horizontal display area HA2.

Referring to FIG. 5, the first horizontal display area HA1 may include the normal area NA, the first optical area OA1, and the second optical area OA2. The second horizontal display area HA2 may include only the normal area NA.

Figure 6:
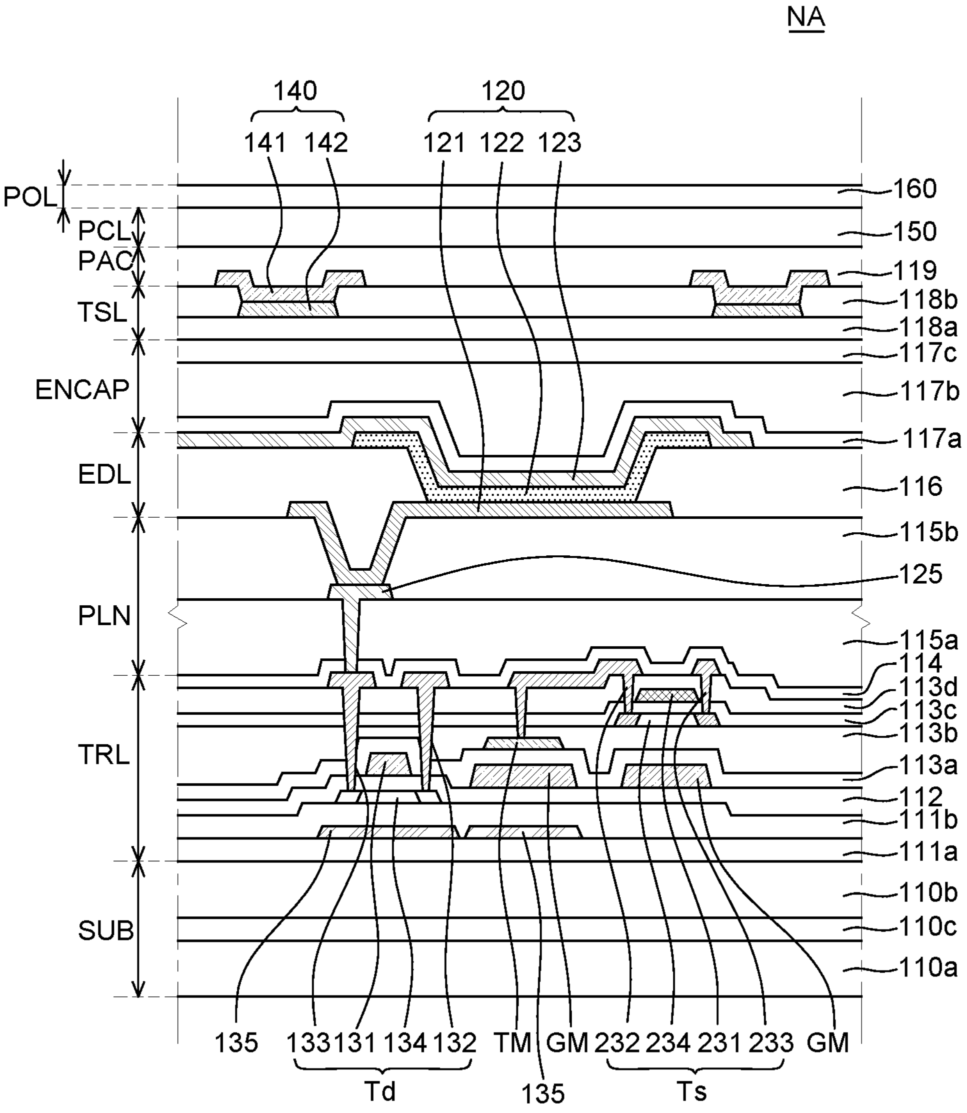
FIG. 6 is a schematic cross-sectional view enlarging a normal area of FIG. 5 according to an exemplary embodiment of the present disclosure.
Figure 7:
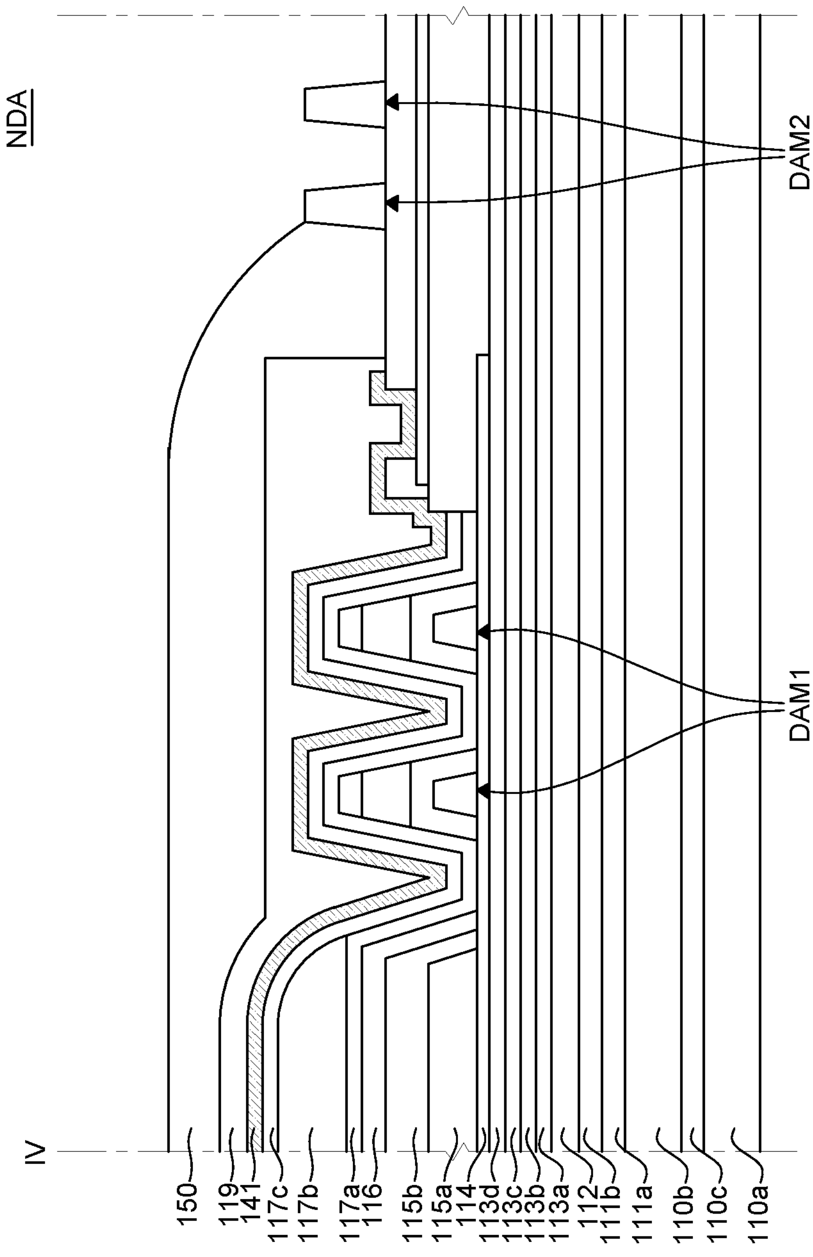
FIG. 7 is a schematic cross-sectional view enlarging a non-display area of FIG. 5 according to an exemplary embodiment of the present disclosure.

FIG. 6 is a schematic cross-sectional view enlarging a normal area NA of FIG. 5 according to one embodiment. FIG. 7 is a schematic cross-sectional view enlarging a non-display area NDA of FIG. 5 according to one embodiment.

Referring to FIG. 6, in the normal area NA, a transistor layer TRL may be disposed above the substrate SUB and a planarization layer PLN may be disposed above the transistor layer TRL. Further, a light emitting diode layer EDL may be disposed above the planarization layer PLN, an encapsulation layer ENCAP may be disposed above the light emitting diode layer EDL, a touch sensing layer TSL may be disposed above the encapsulation layer ENCAP, and a passivation layer PAC may be s disposed above the touch sensing layer TSL. Further, the organic material layer PCL may be disposed above the passivation layer PAC and a polarization layer POL may be disposed above the organic material layer PCL. The above layered structure is merely an example, and the layered structure in the normal area NA is not limited thereto.

The substrate SUB is a component for supporting various components included in the display device 10 and may be formed of an insulating material. The substrate SUB may include a first substrate 110*a*, a second substrate 110*b*, and an interlayer insulating film 110*c*. The interlayer insulating film 110*c* may be disposed between the first substrate 110*a* and the second substrate 110*b*. As described above, the substrate SUB is configured by the first substrate 110*a*, the second substrate 110*b*, and the interlayer insulating film 110*c* to suppress the moisture permeation. For example, the first substrate 110*a* and the second substrate 110*b* may be polyimide (PI) substrates. Alternatively, the first substrate 110*a* and the second substrate 110*b* may also be polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF) substrates.

In the normal area NA, on the transistor layer TRL, various metal layers 131, 132, 133, 134, 231, 232, 233, and 234, various insulating films 111*a*, 111*b*, 112, 113*a*, 113*b*, 113*c*, 113*d* and 114, and other metal layers TM, GM, and 135 for forming a transistor, such as a driving transistor Td and at least one switching transistor Ts and at least one capacitor, may be disposed.

Hereinafter, the laminated structure of the transistor layer TRL will be described in more detail.

A multi-buffer layer 111*a* may be disposed on the second substrate 110*b* and an active buffer layer 110*b* may be disposed on the multi-buffer layer 111*a* and may be made of silicon oxide (SiO), silicon nitride (SiN), amorphous silicon (a-Si), etc.

A first metal layer 135 may be disposed on the multi-buffer layer 111*a*.

Here, the first metal layer 135 may serve as a light shield and may be also referred to as a light shielding layer.

An active buffer layer 111*b* may be disposed on the first metal layer 135. The active layer 111*b* may be made of at least one of an amorphous semiconductor material, a polycrystalline semiconductor material and an oxide semiconductor material.

A first active layer 134 of the driving transistor Td may be disposed on the active buffer layer 111*b*. For example, the first active layer 134 may be formed of polysilicon (p-Si), amorphous silicon (a-Si), or oxide semiconductor, but is not limited thereto. In the meantime, the driving transistor Td includes a first active layer 134, a first gate insulating film 112, a first gate electrode 131, a first interlayer insulating film 113*a*, a second interlayer insulating film 113*b*, a third interlayer insulating film 113*c*, a fourth interlayer insulating film 113*d*, and a first source electrode 132 and a first drain electrode 133. The first active layer 134 is formed on the active buffer layer 111*b*, the first gate insulating film 112 covers the first active layer 134, the first interlayer insulating film 113*a* covers the first gate electrode 131. The second interlayer insulating film 113*b* is disposed on the first interlayer insulating film 113*a*, the third interlayer insulating film 113*c* is disposed on the second interlayer insulting film 113*b*, the fourth interlayer insulating film 113*d* is disposed on the third interlayer insulting film 113*c*, and the first source electrode 132 and the first drain electrode 133 are disposed on the fourth interlayer insulating film 113*d*. Each interlayer insulating film may be a silicon oxide film (SiOx), a silicon nitride film (SiNx), or multiple layers of these compounds.

A first gate insulating film 112 may be disposed on the first active layer 134. The first gate insulating film 112 may be formed of a single layer of silicon oxide SiOx, silicon nitride SiNx, or a multiple layer thereof.

Further, a first gate electrode 131 of the driving transistor Td may be disposed on the first gate insulating film 112. The first gate electrode 131 is disposed on the first gate insulating film 112 so as to overlap the first active layer 134. The first gate electrode 131 may be formed of various conductive materials, for example, magnesium (Mg), aluminum (Al), nickel (Ni), chrome (Cr), molybdenum (Mo), tungsten (W), gold (Au), or an alloy thereof, but is not limited thereto.

A gate material layer GM may be disposed on the first gate insulating film 112 in a position different from forming positions of the driving transistor Td and the switching transistor Ts.

A first interlayer insulating film 113*a* may be disposed on the first gate electrode 131 and the gate material layer GM. A second metal layer TM may be disposed on the first interlayer insulating film 113*a*. A second interlayer insulating film 113*b* may be disposed as covering the second metal layer TM on the first interlayer insulating film 113*a*.

The second interlayer insulating film 113*b* separates the second active layer 234 from the first active layer 134 and provides a base for forming the second active layer 234.

The second active layer 234 of the switching transistor Ts may be disposed on the second interlayer insulating film 113*b*. For example, the second active layer 234 may be formed of polysilicon (p-Si), amorphous silicon (a-Si), or oxide semiconductor, but is not limited thereto.

A second gate insulating film 113*c* may be disposed on the second active layer 234. Further, a second gate electrode 231 of the switching transistor Ts may be disposed on the third interlayer insulating film 113*c*. The second gate electrode 231 is disposed on the third interlayer insulating film 113*c* to overlap the second active layer 234.

The third interlayer insulating film 113*c* covers the second active layer 234 of the switching transistor Ts. The third interlayer insulating film 113*c* is formed on the second active layer 234 so that the third interlayer insulating film is implemented by an inorganic film. For example, the third interlayer insulating film 113*c* may be a single layer of silicon oxide $SiO_2$, silicon nitride SiNx, or a multiple layer thereof.

The second gate electrode 231 is configured by a metal material. For example, the second gate electrode 231 may be formed of a single layer or multiple layers formed of any one of molybdenum (Mo), aluminum (Al), chrome (Cr), gold (Au), titanium (Ti), nickel (Ni), neodymium (Nd), and copper (Cu) or an alloy thereof, but is not limited thereto.

In the meantime, the switching transistor Ts is formed on the second interlayer insulating film 113*b* and includes a second active layer 234, a third interlayer insulating film 113*c* which covers the second active layer 234, a second gate electrode 231 disposed on the third interlayer insulating film 113*c*, a fourth interlayer insulating film 113*d* which covers the second gate electrode 231, and a second source electrode 232 and a second drain electrode 233 disposed on the fourth interlayer insulating film 113*d*.

The switching transistor Ts further includes a gate material layer GM which is located below the first interlayer insulating film 113*a* and overlaps the second active layer 234. The gate material layer GM blocks light which is incident onto the second active layer 234 to ensure the reliability of the switching transistor Ts. The gate material layer GM may be formed by the same material as the first gate electrode 131 and may be formed on an upper surface of the first gate insulating film 112. The gate material layer GM is electrically connected to the second gate electrode 234 to configure a dual gate. The first source electrode 132 and the first drain electrode 133 of the driving transistor Td and the second source electrode 232 and the second drain electrode 233 of the switching transistor Ts may be disposed on the fourth interlayer insulating film 113*d*.

The second source electrode 232 and the second drain electrode 233 are simultaneously formed of the same material as the first source electrode 132 and the first drain electrode 133 on the fourth interlayer insulating film 113*d* to reduce the number of mask processes.

The first source electrode 132 and the first drain electrode 133 may be connected to one side and the other side of the first active layer 134, respectively, through contact holes formed in the fourth interlayer insulating film 113*d*, the third interlayer insulating film 113*c*, the second interlayer insulating film 113*b*, the first interlayer insulating film 113*a*, and the first gate insulating film 112.

The second source electrode 232 and the second drain electrode 233 may be connected to one side and the other side of the second active layer 234, respectively, through contact holes formed in the fourth interlayer insulating film 113*d* and the third interlayer insulating film 113*c*.

The first source electrode 132 and the first drain electrode 133 and the second source electrode 232 and the second drain electrode 233 may be a single layer or multiple layers formed of various conductive materials, for example, magnesium (Mg), aluminum (Al), nickel (Ni), chrome (Cr), molybdenum (Mo), tungsten (W), gold (Au), or an alloy thereof, but are not limited thereto.

A part of the first active layer 134 which overlaps the first gate electrode 131 is a channel region. One of the first source electrode 132 and the first drain electrode 133 is connected to one side of the channel region in the first active layer 134 and the other one is connected to the other side of the channel region in the first active layer 134. The second active layer 234 may be configured with the same shape as the first active layer 134. When the second active layer 234 is implemented by an oxide semiconductor material, the second active layer 234 may include an intrinsic second channel region not doped with impurities, and a second source region and a second drain region doped with impurities to be conductive.

A passivation layer 114 may be disposed on the first source electrode 132 and the first drain electrode 133 and the second source electrode 232 and the second drain electrode 233. The passivation layer 114 is provided to protect the driving transistor Td and may be formed of an inorganic film, for example, a single layer silicon oxide SiOx, silicon nitride SiNx, or a multiple layer thereof.

In the meantime, the gate material layer GM and the second metal layer TM are disposed on the first gate insulating film 112 so as to overlap to implement a capacitor Cst. For example, the second metal layer TM may be a single layer or a multilayer formed of any one of molybdenum (Mo), aluminum (Al), chrome (Cr), gold (Au), titanium (Ti), nickel (Ni), neodymium (Nd), and copper (Cu), or an alloy thereof.

The capacitor Cst stores a data voltage which is applied through the data line DL for a predetermined period and then supplies the data voltage to the light emitting diode (ED) 120. The capacitor Cst includes two corresponding electrodes (for example, the gate material layer GM and the second metal layer TM) and a dielectric material disposed therebetween (for example, the first interlayer insulating film 113*a*). The first interlayer insulating film 113*a* is located between the gate material layer GM and the second metal layer TM.

The gate material layer GM or the second metal layer TM of the capacitor Cst may be electrically connected to the second source electrode 232 or the second drain electrode 233 of the switching transistor Ts. However, it is not limited thereto and a connection relationship of the capacitor Cst may vary according to the pixel driving circuit.

Further, the first metal layer 135 is disposed on the multi-buffer layer 111*a* so as to further overlap the gate material layer GM and the second metal layer TM to configure a double capacitor Cst.

In the exemplary embodiment of the present disclosure, at least one switching transistor Ts uses the oxide semiconductor as an active layer. The transistor which uses the oxide semiconductor as an active layer has an excellent leakage current blocking effect and has a manufacturing cost which is cheaper than the transistor which uses the polycrystalline silicon as an active layer. Accordingly, in order to reduce the power consumption and save the manufacturing cost, the pixel circuit according to the exemplary embodiment of the present disclosure includes a driving transistor or at least one switching transistor which uses the oxide semiconductor material.

All the transistors which configure the pixel circuit including the driving transistor may implement the active layer using the oxide semiconductor or only some of the transistors may implement the active layer using the oxide semiconductor.

However, it is difficult for the transistor using the oxide semiconductor to ensure the reliability and the transistor using the polycrystalline silicon has a faster operation speed and excellent reliability. Accordingly, the exemplary embodiment of the present disclosure includes the transistor using the oxide semiconductor and the transistor using the polycrystalline silicon. However, it is not limited thereto and in accordance with the design, only a transistor using the oxide semiconductor is applied or only a transistor using the polycrystalline silicon is applied to configure the pixel circuit.

The planarization layer PLN may be located above the transistor layer TRL.

The planarization layer PLN may include a first planarization layer 115*a* and a second planarization layer 115*b*. The planarization layer PLN protects the driving transistor Td and planarizes an upper portion of the driving transistor. The first planarization layer 115*a* and the second planarization layer 115*b*, which may be a kind of inorganic or organic dielectric, may be made of any one of photo acrylic, polyimide, benzocyclobutene resin, and acrylate, etc.

The first planarization layer 115*a* may be disposed on the passivation layer 114.

The connection electrode 125 may be disposed on the first planarization layer 115*a*.

The connection electrode 125 may be connected to one of the first source electrode 132 and the first drain electrode 133 through a contact hole provided in the first planarization layer 115*a*.

The second planarization layer 115*b* may be disposed on the connection electrode 125.

The light emitting diode layer EDL may be located above the second planarization layer 115*b*.

Hereinafter, a laminated structure of the light emitting diode layer EDL will be described in detail.

The anode electrode 121 may be disposed on the second planarization layer 115*b*. At this time, the anode electrode 121 may be electrically connected to the connection electrode 125 through the contact hole provided in the second planarization layer 115*b*. The anode electrode 121 may be formed of a metallic material.

When the display device 10 is a top emission type in which light emitted from the light emitting diode (ED) 120 is emitted above the substrate SUB in which the light emitting diode (ED) 120 is disposed, the anode electrode 121 may further include a transparent conductive layer and a reflective layer on the transparent conductor layer. For example, the transparent conductive layer may be formed of transparent conductive oxide such as ITO or IZO and the reflective layer may be formed of copper (Cu), nickel (Ni), plumbum (Pb), silver (Ag), aluminum (Al), gold (Au), molybdenum (Mo), tungsten (W), chrome (Cr), or an alloy thereof.

The bank 116 may be disposed as covering the anode electrode 121. A part of the bank 116 corresponding to an emission area of the sub pixel may be open. A part of the anode electrode 121 may be exposed through the open part of the bank 116 (hereinafter, referred to as an open area). At this time, the bank 116 may be formed of an inorganic insulating material, such as aluminum nitride, zirconium nitride, titanium nitride, hafnium nitride, tantalum nitride, aluminum oxide, titanium oxide, silicon nitride SiNx or silicon oxide SiOx, or an organic insulating material, such as benzocyclobutene resin, polyimide resin, acrylic resin or imide resin, but is not limited thereto.

Even though it is not illustrated, a spacer may be further located on the bank 116. The spacer may be configured with the same material as the bank 116.

The emission layer 122 may be disposed in the open area of the bank 116 and in the vicinity of the open area of the bank. Therefore, the emission layer 122 may be disposed on the anode electrode 121 exposed through the open area of the bank 116.

The cathode electrode 123 may be disposed on the emission layer 122.

The light emitting diode (ED) 120 may be formed by the anode electrode 121, the emission layer 122, and the cathode electrode 123. The emission layer 122 may include a plurality of organic films.

The encapsulation layer ENCAP may be located above the above-described light emitting diode layer EDL.

The encapsulation layer ENCAP may have a single layer structure or a multi-layered structure. For example, the encapsulation layer ENCAP may include a first encapsulation layer 117*a*, a second encapsulation layer 117*b*, and a third encapsulation layer 117*c*.

At this time, the first encapsulation layer 117*a* and the third encapsulation layer 117*c* may be configured by inorganic layers and the second encapsulation layer 117*b* may be configured by an organic layer. Among the first encapsulation layer 117*a*, the second encapsulation layer 117*b*, and the third encapsulation layer 117*c*, the second encapsulation layer 117*b* is thickest and may serve as a planarization layer.

The first encapsulation layer 117*a* may be disposed on the cathode electrode 123 and may be disposed to be most adjacent to the light emitting diode (ED) 120. The first encapsulation layer 117*a* may be formed of an inorganic insulating material on which low-temperature deposition can be performed. For example, the first encapsulation layer 117*a* may be configured by silicon nitride SiNx, silicon oxide SiOx, silicon oxynitride SiON, or aluminum oxide $Al_2O_3$. The first encapsulation layer 117*a* is deposited under a low temperature atmosphere so that during the deposition process, the damage of the emission layer 122 including an organic material which is vulnerable to the high temperature atmosphere may be suppressed.

The second encapsulation layer 117*b* may be formed to have a smaller area than that of the first encapsulation layer 117*a*. In this case, the second encapsulation layer 117*b* may be formed to expose both ends of the first encapsulation layer 117*a*. The second encapsulation layer 117*b* may serve as a buffer to alleviate stress between the layers due to bending of the flexible display device and to enhance planarization performance.

For example, the second encapsulation layer 117*b* may be formed of an organic insulating material, such as acrylic resin, epoxy resin, polyimide, polyethylene, or silicon oxy carbon SiOC. For example, the second encapsulation layer 117*b* may be formed by an inkjet method, but is not limited thereto.

Even though it is not illustrated, a color filter may be disposed on the encapsulation layer ENCAP.

Referring to FIG. 7, a first dam DAM1 which blocks the flow of the second encapsulation layer 117*b* which configures the encapsulation layer ENCAP may be disposed in the non-display area NDA. In order to suppress the collapse of the encapsulation layer ENCAP, one or more first dams DAM1 may be disposed at an end portion of the inclined surface of the encapsulation layer ENCAP or in the vicinity thereof. One or more first dams DAM1 may be disposed in a boundary of the display area DA and the non-display area NDA or in the vicinity of the boundary. The first dam DAM1 may be formed of at least one or more layers formed of an organic material. For example, the first dam DAM1 may include a lower layer formed on the same layer with the same material as the second planarization layer 115*b* and an upper layer formed on the same layer with the same material as the bank 116, but is not limited thereto. Further, a height of the first dam DAM1 may be controlled by adding a layer formed of the same material as the spacer on the upper layer of the first dam DAM1, but is not limited thereto.

The second encapsulation layer 117*b* including an organic material may be located only on an inner side surface of an innermost first dam DAM1. For example, the second encapsulation layer 117*b* may not be disposed on an upper portion of all the dams. Alternatively, the second encapsulation layer 117*b* including an organic material may be located above an innermost dam of the first DAM1. For example, the second encapsulation layer 117*b* may be located to extend to an upper portion of the innermost dam of the first dam DAM1. Alternatively, the second encapsulation layer 117*b* may be located to extend to an upper portion of a dam located at the outside of the first dam DAM1 by passing at least an upper portion of the innermost dam of the first dam DAM1.

The third encapsulation layer 117*c* may be formed above the substrate SUB on which the second encapsulation layer 117*b* is formed so as to cover upper surfaces and side surfaces of the second encapsulation layer 117*b* and the first encapsulation layer 117a. At this time, the third encapsulation layer 117c may minimize or block the permeation of external moisture or oxygen into the first encapsulation layer 117a and the second encapsulation layer 117b. For example, the third encapsulation layer 117c may be configured by an inorganic insulating material, such as silicon nitride SiNx, silicon oxide SiOx, silicon oxynitride SiON, or aluminum oxide $Al_2O_3$.

The touch sensing layer TSL may be disposed above the above-described encapsulation layer ENCAP.

A touch buffer film 118a may be disposed above the encapsulation layer ENCAP and a touch line 140 may be disposed on the touch buffer film 118a.

The touch line 140 may include a touch sensor metal 141 and a bridge metal 142 located on different layers. A touch interlayer insulating film 118b may be disposed between the touch sensor metal 141 and the bridge metal 142.

For example, the touch sensor metal 141 may include a first touch sensor metal, a second touch sensor metal, and a third touch sensor metal which are disposed to be adjacent to each other. The first touch sensor metal and the second touch sensor metal are electrically connected. However, when the third touch sensor metal is disposed between the first touch sensor metal and the second touch sensor metal, the first touch sensor metal and the second touch sensor metal may be electrically connected by means of the bridge metal 142 disposed on a different layer. The bridge metal 142 may be insulated from the third touch sensor metal by a touch interlayer insulating film 118b.

When the touch sensing layer TSL is formed, chemical solutions (for example, developer or etchant) used for the process, moisture from the outside, or the like may be generated. The touch buffer film 118a is disposed and the touch sensing layer TSL is disposed thereon to suppress the permeation of chemical solutions or moisture during the manufacturing of the touch sensing layer TSL into the emission layer 122 including an organic material. By doing this, the touch buffer film 118a may suppress the damage of the emission layer 122 which is vulnerable to the chemical solution or the moisture.

The touch buffer film 118a may be formed of an organic insulating material which may be formed at a temperature lower than a predetermined temperature (for example, 100° C.) to suppress the damage of the emission layer 122 including an organic material which is vulnerable to a high temperature. The organic insulating material has a low permittivity of 1 to 3 (e.g., 2). For example, the touch buffer film 118a may be formed of an acrylic, epoxy, or siloxane based material. As the flexible display device is bent, the encapsulation layer ENCAP may be damaged and the touch sensor metal 141 disposed above the touch buffer film 118a may be broken. Even though the flexible display device is bent, the touch buffer film 118a which is configured of an organic insulating material to have a planarization performance may suppress the damage of the encapsulation layer ENCAP and the breakage of the metals 141 and 142 which configure the touch line 140.

The passivation layer (PAC) 119 may be disposed so as to cover the touch line 140. The passivation layer 119 may be configured by an organic insulating film.

The organic material layer (PCL) 150 is disposed so as to cover the passivation layer 119.

When only the passivation layer 119 formed of the organic insulating film is disposed on the uppermost layer of the display device 10, a step caused by the touch sensing layer TSL disposed below the passivation layer 119 is not completely supplemented only with the passivation layer 119. Therefore, there may be a problem in that a stain caused by the touch line 140 is visible to the user.

The organic material layer 150 formed of an organic insulating film is added above the passivation layer 119 to suppress the step on the uppermost layer of the display device 10, thereby improving the visibility of the display device 10.

The organic material layer 150 may be formed of the same material as the second encapsulation layer 117b of the encapsulation layer ENCAP and for example, may be formed of an organic insulating material, such as acrylic resin, epoxy resin, polyimide, polyethylene, or silicon oxy carbon SiOC. The organic material layer 150 may be formed by the inkjet method, but is not limited thereto.

Referring to FIG. 7 together, a second dam DAM2 may be further provided at the outer periphery of the first dam DAM1 disposed in the non-display area NDA. For example, the second dam DAM2 may be formed on the same layer with the same material as the passivation layer 119. A height of the second dam DAM2 may be higher than the height of the first dam DAM1 and may block the organic material layer 150 from flowing to the pad disposed in the non-display area NDA.

The polarization layer (POL) 160 is disposed on the organic material layer 150.

The polarization layer 160 suppress reflection of external light on the display area DA of the substrate SUB. When the display device 10 is used at the outside, external natural light enters to be reflected by a reflective layer included in the anode electrode 121 of the light emitting diode or reflected by an electrode which is formed of a metal and disposed below the light emitting diode (ED) 120. Therefore, the image of the display device 10 may not be visibly recognized due to the light reflected as described above. The polarization layer 160 polarizes the light entering from the outside to a specific direction and suppresses the reflected light from being emitted to the outside of the display device 10.

Even though it is not illustrated, a cover glass may be bonded onto the polarization layer 160 through an adhesive layer. The adhesive layer may serve to adhere the components of the display device 100 to each other, and for example, may be formed using an optically clear display adhesive, such as a pressure sensitive adhesive, an optical clear adhesive (OCR) or an optical clear resin (OCR), but is not limited thereto.

The cover glass may protect the component of the display device 10 from the external shock and suppress damages such as a scratch.

Figure 8:
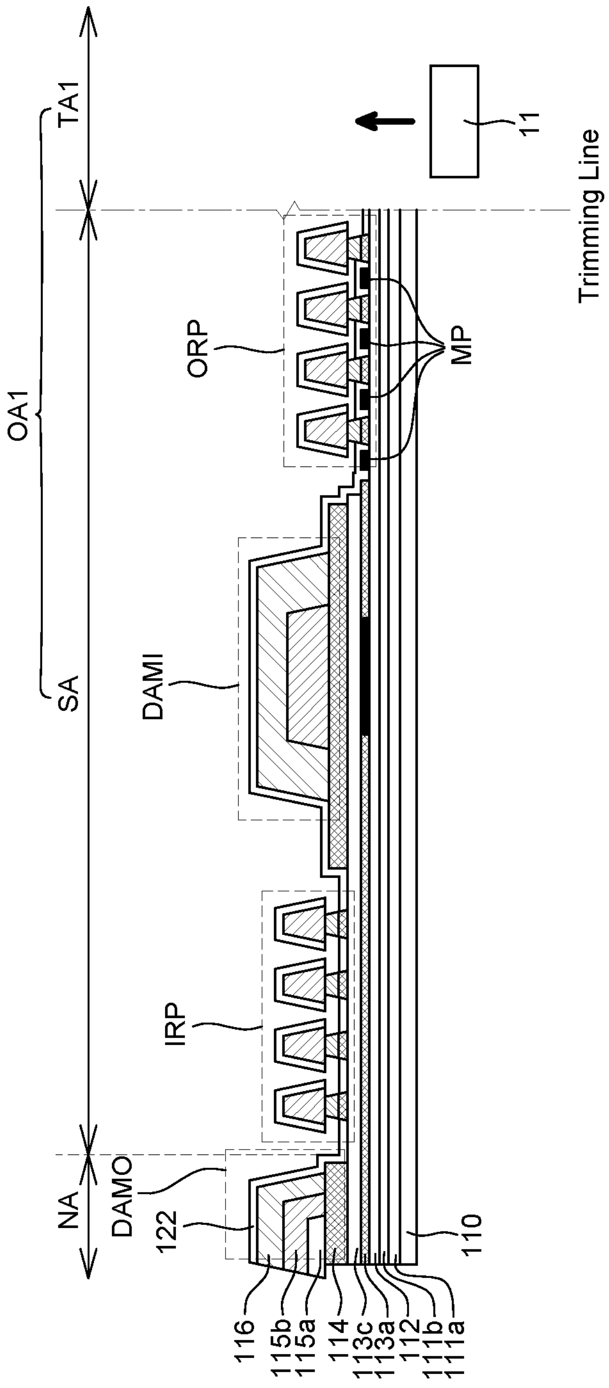
FIG. 8 is a view illustrating a structure of a first optical area, in a display device according to another exemplary embodiment of the present disclosure.

FIG. 8 is a view illustrating a structure of a first optical area, in a display device according to another exemplary embodiment of the present disclosure.

Referring to FIG. 8, the first optical area OA1 includes a first transmission area TA1 having a hole shape and a surrounding area SA and the display area DA may be located in the outer periphery of the surrounding area SA.

In the first transmission area TA1, the optical electronic device 11 which is located below the display panel 100 and at least partially overlaps the first transmission area TA1 may be located.

Referring to FIG. 8, the display device according to the exemplary embodiments may include a "dam structure", such as an outer dam DAMO located in the display area DA and an inner dam DAMI located in the surrounding area SA. Such a dam structure may have a triple layered structure which is vertically formed to the substrate SUB. For example, the dam structure may include a first layer formed by planarization layers 115*a* and 115*b*, a second layer formed by the bank 116, and a third layer formed by a spacer (not illustrated). In such a dam structure, at least a part of the emission layer EL may be located on the spacer.

Some configurations which configure the light emitting diode may be laminated on the inner dam DAMI. For example, the emission layer EL and the common electrode (not illustrated) may be laminated over the inner dam DAMI.

Irregular patterns IRP and ORP are located inside and outside the inner dam DAMI. The irregular patterns IRP and ORP may include mountains including insulating layers (for example, 113A, 113*a*, 113*c*, and 114) and valleys from which at least a part of the insulating layer is removed.

The emission layer EL may be disposed in at least partial area on the irregular patterns IRP and ORP. The emission layer EL may be an organic emission layer including an organic material. The emission layer EL may extend to at least a partial area of the surrounding area SA in the display area DA.

Referring to FIG. 8, the emission layer EL is discontinuously located in an inner irregular pattern IRP and an outer irregular pattern ORP. According to this, even though moisture entering from the first transmission area TA1 having a hole shape permeates the emission layer EL located in the surrounding area SA, the moisture does not permeate to the emission layer EL located in the display area DA. For example, the emission layer EL is discontinuously present in the irregular patterns IRP and ORP, so that not only an effect of lengthening the moisture permeation path, but also an effect of suppressing the moisture entering the emission layer EL from spreading to the display area DA may be achieved.

In the meantime, referring to FIG. 8, mountains in the inner irregular pattern IRP and the outer irregular pattern ORP may have different heights. The height of the mountain in the inner irregular pattern IRP may be higher than the height of the mountain in the outer irregular pattern ORP.

The reason why the mountains in the inner irregular pattern IRP and the outer irregular pattern ORP have different heights is because interlayer insulating films and passivation layers (for example, 113*a*, 113*c*, 114, and 113A) included in the mountains in the inner irregular pattern IRP and the outer irregular pattern ORP are different.

For example, referring to FIG. 8, the mountain of the inner irregular pattern IRP includes a passivation layer 114, but does not include the third interlayer insulating film 113*c* and the first interlayer insulating film 113*a*. The mountain of the outer irregular pattern ORP includes the third interlayer insulating film 113*c* and the first interlayer insulating film 113*a*, but does not include the passivation layer 114.

In the meantime, referring to FIG. 8, a bottom surface of the valley located in the outer irregular pattern ORP may be located to be lower than a bottom surface of the valley located in the inner irregular pattern IRP.

For example, the valley of the outer irregular pattern ORP may be formed by removing at least a part of the first interlayer insulating film 113*a* and the third interlayer insulating film 113*c*.

Referring to FIG. 8, during a process of forming the valley of the irregular pattern RP by removing the first interlayer insulating film 113*a* from the outer irregular pattern ORP, there may be a risk of causing the damage on the first gate insulating film 112 or the damage on the insulating films (for example, 111*a* and 111*b*) located below the first gate insulating film 112.

Therefore, a metal pattern MP is located in the valley located in the outer irregular pattern ORP.

Referring to FIG. 8, for example, the metal pattern MP may be disposed in the surrounding area SA with the same shape as the shape of the valley located in the outer irregular pattern ORP. The metal pattern MP located so as to correspond to the valley of the outer irregular pattern ORP may serve as an "etching stopper".

Alternatively, the metal pattern MP may be located to overlap the mountain located in the outer irregular pattern ORP. For example, the metal pattern MP may be located broadly below the outer irregular pattern ORP. In this case, the metal pattern MP may also perform a function of suppressing a fine crack generated in the first transmission area TA1 having a hole shape from spreading to the display area DA. In this case, the metal pattern MP may perform not only the function of the etching stopper but also the function of the crack stopper.

The metal pattern MP may be located on the first gate insulating film 112. The metal pattern MP may be formed of the same material as the gate electrode of the above-described driving transistor DT.

The metal pattern MP is formed of different materials from that of the insulating films (for example, the first gate insulating film 112 and the first interlayer insulating film 113*a*) on and below the metal pattern MP. Accordingly, even though the insulating film (for example, the first interlayer insulating film 113*a*) which covers the metal pattern MP is removed in the etching process, the insulating film (for example, the first gate insulating film 112) below the metal pattern MP may be protected.

In the meantime, an alignment mark (not shown) may be located in the surrounding area SA. The alignment mark is also referred to as an "alignment key". The alignment mark may be disposed on the substrate 110 to form the first transmission area TA1 having a hole shape by etching a predetermined area from the substrate 110.

The alignment mark may be disposed in the surrounding area SA to have a shape corresponding to a shape of the first transmission area TA1 having a hole shape or may be disposed in the vicinity of the first transmission area TA1 having a hole shape which is different from the shape of the first transmission area TA1 having a hole shapes. For example, the alignment mark may be located only in a partial area among up, down, left, and right sides of the first transmission area TA1 having a hole shape.

In the meantime, the alignment mark may be located on the same layer as the metal pattern MP. For example, the alignment mark may be formed of the same material as the gate electrode. The alignment mark may be located on the first gate insulating film 112. The alignment mark may be located as being covered by the first interlayer insulating film 113*a*.

For example, the alignment mark may be located in an area overlapping the inner dam DAMI. For example, the alignment mark may be located between the inner irregular pattern IRP and the outer irregular pattern ORP.

Figure 9A:
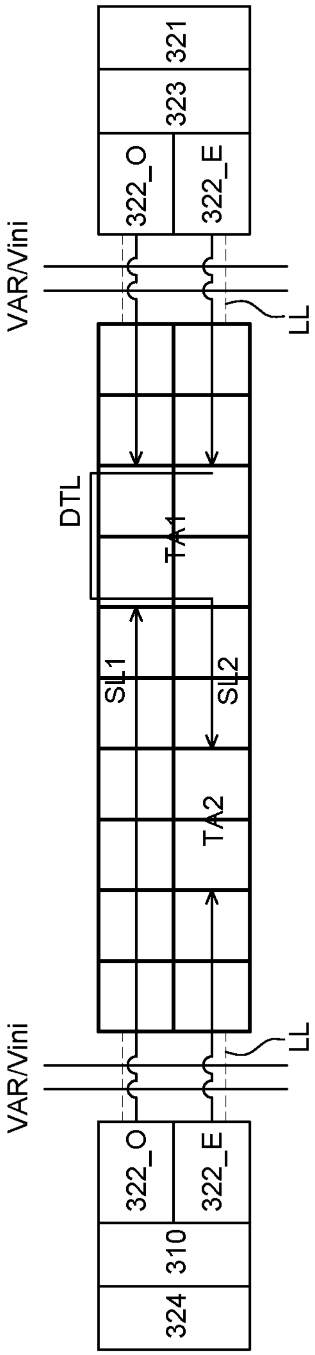
FIGS. 9A to 9C are views for a driving signal applied to both sides of a display area, in a display device according to an exemplary embodiment of the present disclosure.
Figure 9B:
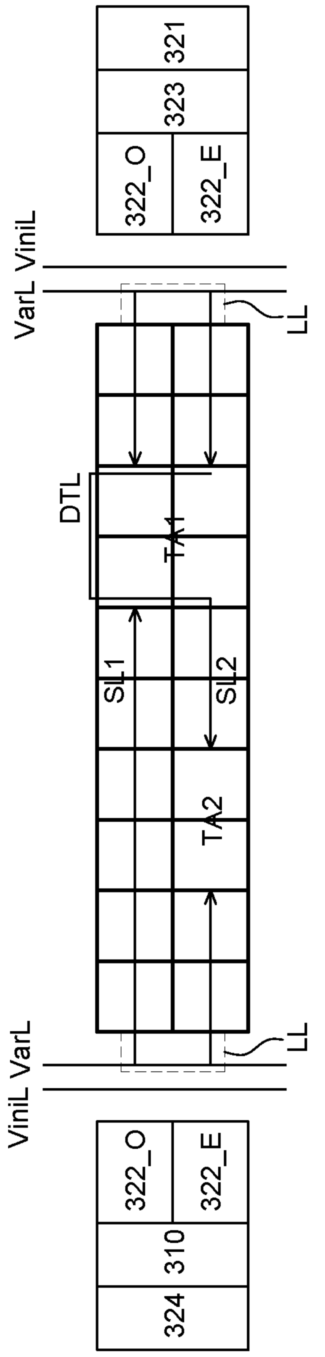
Figure 9C:
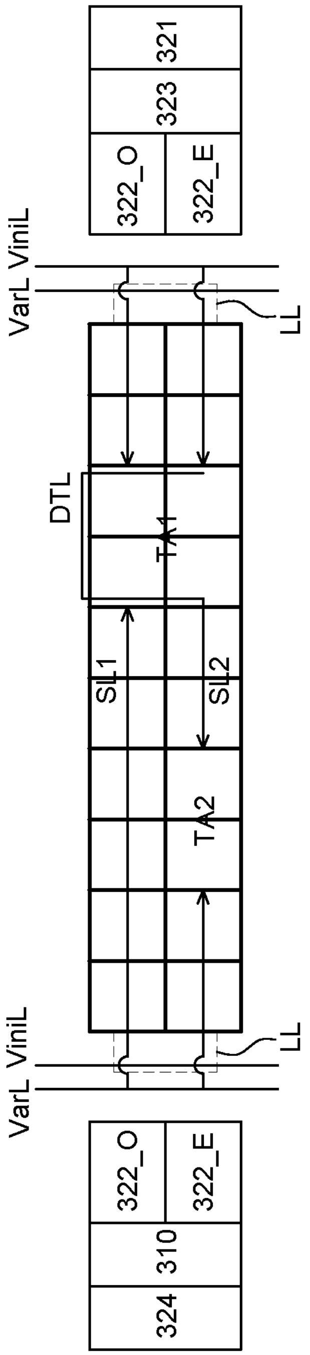

FIGS. 9A to 9C are views for a driving signal applied to both sides (e.g., left and right sides) of a display area, in a display device according to an exemplary embodiment of the present disclosure.

Referring to FIGS. 9A to 9C, at least one scan driver 320, a first initialization voltage bus line VarL, and a second initialization voltage bus line ViniL are disposed on both sides of the display area DA to be driven in a dual feeding method of applying a driving signal to every pixel row in both directions.

First, referring to FIG. 9A, in a plurality of pixel rows in which at least one or more optical areas OA are disposed, the second scan driver 322 is configured by an odd-numbered second scan driver 322_O and an even-numbered second scan driver 322_E in one shift register stage STGn. Each odd-numbered second scan driver 322_O and even-numbered second scan driver 322_E may be disposed on both sides (e.g., left and right sides) of the display area DA.

The odd-numbered second scan driver 322_O is connected to a gate line of an odd-numbered pixel row in which at least one or more optical areas OA are disposed through a link line LL to apply a driving signal. The even-numbered second scan driver 322_E is connected to a gate line of an even-numbered pixel row in which at least one or more optical areas OA are disposed through a link line LL to apply a driving signal.

At this time, the gate line of the odd-numbered pixel row in which at least one or more optical areas OA are disposed may be a first signal line SL1 and the gate line of the even-numbered pixel row in which at least one or more optical areas OA are disposed may be a second signal line SL2. Alternatively, the gate line of the odd-numbered pixel row in which at least one or more optical areas OA are disposed may be a second signal line SL2 and the gate line of the even-numbered pixel row in which at least one or more optical areas OA are disposed may be a first signal line SL1. Each of the first signal line SL1 and the second signal line SL2 transmits the same driving signal and may be disposed to extend in the pixel row direction.

Referring to FIG. 9A, the first signal line SL1 and the second signal line SL2 are connected to a detour line DTL which extends in a row direction and a column direction of the pixel along a boundary of the transmission area TA of the optical area OA to transmit the same driving signal to each pixel row.

The detour line DTL is disposed on the same layer as the first signal line SL1 and the second signal line SL2 to be integrally formed with the first signal line SL1 and the second signal line SL2. Even though the detour line is separately formed from the first signal line SL1 and the second signal line SL2, the detour line may be formed with the same material. Alternatively, the detour line DTL is disposed on a different layer from the first signal line SL1 and the second signal line SL2 to be electrically connected thereto through a contact hole and may be formed with a different material from those of the first signal line SL1 and the second signal line SL2.

For example, the detour line DTL may be formed using one of various metal layers, such as a first gate electrode 131, a first source electrode 132, a first drain electrode 133, a first metal layer 135, a second gate electrode 231, a second source electrode 232, a second drain electrode 233, a gate material layer GM, and a second metal layer TM.

Referring to FIG. 9A, when the optical area OA includes a first optical area OA1 and a second optical area OA2 having different sizes, the first transmission area TA1 of the first optical area OA1 may be larger than the second transmission area TA2 of the second optical area OA2. For example, the first signal line SL1 may be disposed in a pixel row above or below the second transmission area TA2 and the second signal line SL2 may be disposed in pixel rows on both sides of the second transmission area TA2. Alternatively, the second signal line SL2 may be disposed in a pixel row above or below the second transmission area TA2 and the first signal line SL1 may be disposed in pixel rows on both sides of the second transmission area TA2. Further, the first signal line SL1 and the second signal line SL2 disposed on both sides of the first transmission area TA1 may be connected through the detour line DTL disposed along the boundary of the first transmission area TA1.

Further, referring to FIG. 9A, the first signal line SL1 and the second signal line SL2 may be connected to the odd-numbered second scan driver 322_O and the even-numbered second scan driver 322_E through the link line LL. The link line LL is disposed in the non-display area NDA and may be formed on the same layer with the same material as the first signal line SL1 and the second signal line SL2. Alternatively, the link line LL is disposed on a different layer with the different material from the first signal line SL1 and the second signal line SL2 to be electrically connected to the first signal line SL1 and the second signal line SL2 through a contact hole.

For example, the link line LL may be formed using one of various metal layers, such as a first gate electrode 131, a first source electrode 132, a first drain electrode 133, a first metal layer 135, a second gate electrode 231, a second source electrode 232, a second drain electrode 233, a gate material layer GM, and a second metal layer TM.

Next, referring to FIGS. 9B and 9C, a first initialization voltage bus line VarL and a second initialization voltage bus line ViniL may be disposed on both sides of the display area DA to be closer to the display area DA than the gate driver. In FIG. 9B, even though it is illustrated that the first initialization voltage bus line VarL is closer to the display area DA than the second initialization voltage bus line ViniL, it is not limited thereto and the second initialization voltage bus line ViniL may be disposed to be closer to the display area DA than the first initialization voltage bus line ViniL. Alternatively, the first initialization voltage bus line VarL and the second initialization voltage bus line ViniL may be sequentially disposed from the left to the right on both sides of the display area DA.

The first initialization voltage bus line VarL and the second initialization voltage bus line ViniL are connected to the power line VL which is branched in every pixel row in which at least one or more optical areas OA is disposed in the display area DA through a link line LL to apply a voltage to each pixel. At this time, the power line of the odd-numbered pixel row in which at least one optical area OA is disposed may be a first signal line SL1 and the power line of the even-numbered pixel row in which at least one optical area OA is disposed may be a second signal line SL2.

As in FIG. 9A, also in FIGS. 9B and 9C, the link line LL is disposed in the non-display area NDA and the first signal line SL1 and the second signal line SL2 may be connected to the first initialization voltage bus line VarL and the second initialization voltage bus line ViniL through the link line LL. Further, the first signal line SL1 and the second signal line SL2 disposed on both sides of the first transmission area TA1 of the first optical area OA1 may be connected through the detour line DTL disposed along the boundary of the first transmission area TA1 of the first optical area OA1.

Accordingly, the first signal line SL1 and the second signal line SL2 are not disposed in the transmission area TA of at least one optical area OA so that the transmittance may be further improved.

Figure 10:
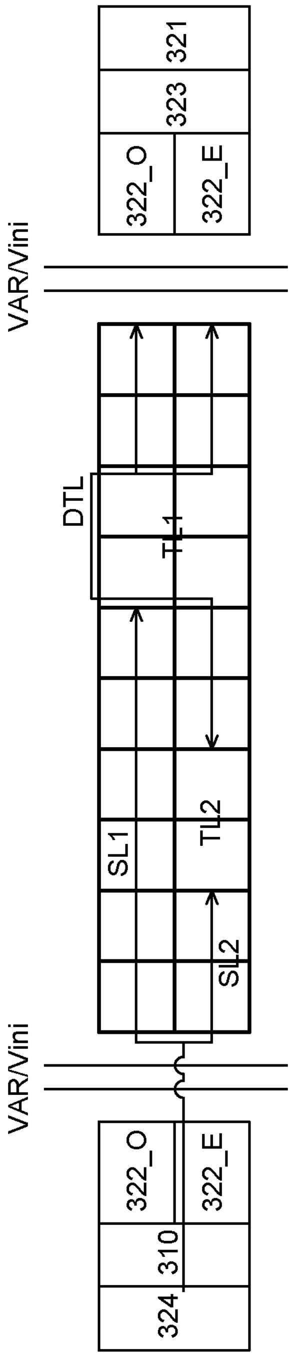
FIG. 10 is a view for a driving signal applied to one side of a display area, in a display device according to another exemplary embodiment of the present disclosure.

FIG. 10 is a view for a driving signal applied to one side of a display area, in a display device according to another exemplary embodiment of the present disclosure.

Referring to FIG. 10, at least one scan driver 320 is disposed on one side (for example, left or right side) of the display area DA to be driven by a single feeding method of applying a driving signal to each pixel row.

For example, in a plurality of pixel rows in which at least one optical area OA is disposed, a fourth scan driver 324 is disposed on one side of the display area DA to drive at least two adjacent pixel rows in one shift register stage STGn. In other words, the fourth scan driver 324 close to the second optical area OA2 is connected to the first signal line SL1 and the second signal line SL2 of the pixel row in which at least one or more optical areas OA are disposed through the link line LL to apply a driving signal.

The first signal line SL1 and the second signal line SL2 are disposed to extend in a pixel row direction and are connected to the detour line DTL extending in a row direction and a column direction of the pixel along the boundary of the transmission area TA of at least one optical area OA to transmit the same driving signal to each pixel row.

When the first optical area OA1 and the second optical area OA2 are formed to have different sizes, the first signal line SL1 and the second signal line SL2 disposed on both sides of the first transmission area TA1 of the first optical area OA1 are connected through the detour line DTL disposed along the boundary of the first transmission area TA1 of the first optical area OA1.

The first signal line SL1 may be disposed in a pixel row above or below the second transmission area TA2 and the second signal line SL2 may be disposed in pixel rows on both sides of the second transmission area TA2. Specifically, the second signal line SL2 disposed between the first transmission area TA1 and the second transmission area TA2 is connected to the detour line DTL to supply a driving signal through the first signal line SL1 and the detour line DTL.

Further, the link line LL is disposed in the non-display area NDA and is branched from the non-display area NDA adjacent to the display area DA to be connected to the first signal line SL1 and the second signal line SL2.

Figure 11:
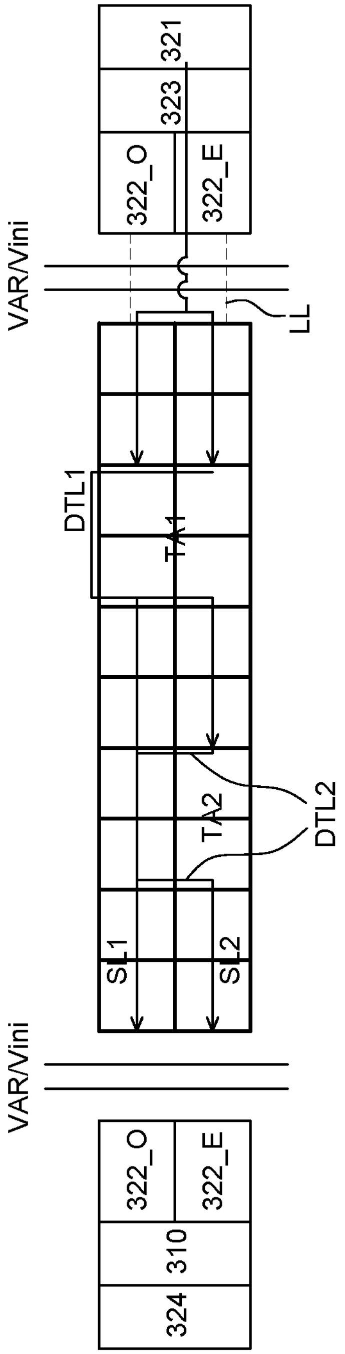
FIG. 11 is a view for a driving signal applied to the other side of a display area, in a display device according to still another exemplary embodiment of the present disclosure.

FIG. 11 is a view for a driving signal applied to the other side of a display area, in a display device according to still another exemplary embodiment of the present disclosure.

Referring to FIG. 11, at least one scan driver 320 is disposed on the other side of the display area DA to be driven by a single feeding method of applying a driving signal to each pixel row.

For example, in a plurality of pixel rows in which at least one optical area OA is disposed, a first scan driver 321 or a third scan driver 323 is disposed on the other side of the display area DA to drive at least two adjacent pixel rows in one shift register stage STGn. In other words, the first scan driver 321 or the third scan driver 323 close to the first optical area OA1 is connected to the first signal line SL1 FIG. 9A and the second signal line SL2 of the pixel row in which at least one or more optical areas OA are disposed through the link line LL to apply a driving signal.

The first signal line SL1 and the second signal line SL2 are disposed to extend in the pixel row direction. The first signal line SL1 is connected to a first detour line DTL1 extending to the row direction and the column direction of the pixel along the boundary of the first transmission area TA1 in the first optical area OA1 and the second signal line SL2 is connected to a second detour line DTL2 extending to the column direction of the pixel along the boundary of the second transmission area TA1 in the second optical area OA2 to transmit the same driving signal to each pixel row.

When the first optical area OA1 and the second optical area OA2 are formed to have different sizes, the first signal line SL1 and the second signal line SL2 disposed on both sides of the first transmission area TA1 of the first optical area OA1 are connected through the first detour line DTL1 disposed along the boundary of the first transmission area TA1 of the first optical area OA1.

The first signal line SL1 may be disposed in a pixel row above or below the second transmission area TA2 and the second signal line SL2 may be disposed in pixel rows on both sides of the second transmission area TA2. The second signal line SL2 disposed on both sides of the second transmission area TA2 may be connected to the second detour line DTL2 disposed in the pixel column direction along the boundary of the second transmission area TA2. The second detour line DTL2 may be connected to both the first signal line SL1 and the second signal line SL2.

As in FIG. 10, the link line LL is branched from the non-display area NDA adjacent to the display area DA to be connected to the first signal line SL1 and the second signal line SL2.

Figure 12:
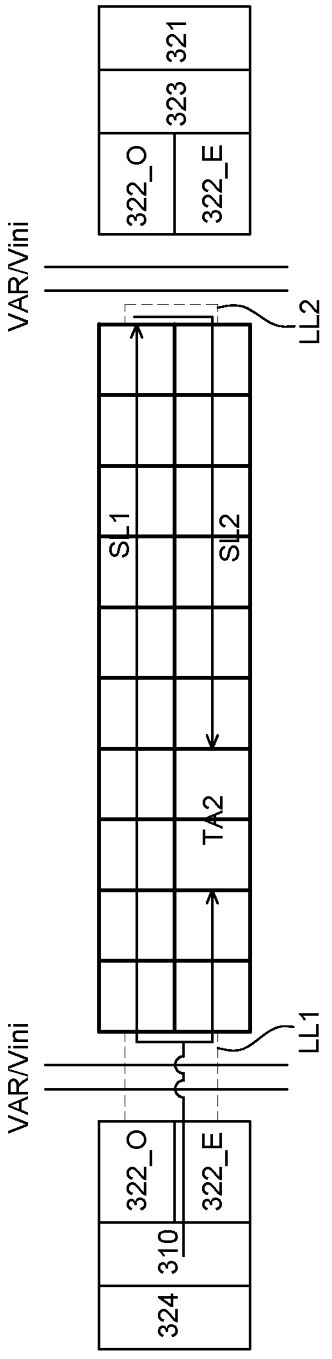
FIG. 12 is a view for a driving signal applied to a display area, in a display device according to still another exemplary embodiment of the present disclosure.

FIG. 12 is a view for a driving signal applied to a display area, in a display device according to still another exemplary embodiment of the present disclosure.

Referring to FIG. 12, the emission control signal driver 310 is disposed on one side of the display area DA to be driven by a single feeding method of applying a driving signal to each pixel row.

For example, in a plurality of pixel rows in which at least one optical area OA is disposed, the emission control signal driver 310 is disposed on one side of the display area DA to drive at least two adjacent pixel rows in one shift register stage STGn. In other words, the emission control signal driver 310 close to the second optical area OA2 is connected to the first signal line SL1 and the second signal line SL2 of the pixel row in which at least one or more optical areas OA are disposed through the first link line LL1 to apply a driving signal.

Further, if there is only one optical area OA in the plurality of pixel rows, the first signal line SL1 and the second signal line SL2 are disposed to extend in the pixel row direction and are connected through the second link line LL2 to transmit the same driving signal to each pixel row.

In other words, the first signal line SL1 may be disposed in a pixel row above or below the second transmission area TA2 and the second signal line SL2 may be disposed in pixel rows on both sides of the second transmission area TA2. The first link line LL1 and the second link line LL2 may be disposed in the non-display area NDA. As in FIGS. 10 and 11, the first link line LL1 is branched from the non-display area NDA adjacent to the display area DA to be connected to the first signal line SL1 and the second signal line SL2. The second link line LL2 is disposed in the non-display area NDA opposite to the first link line LL1 and may supply a driving signal supplied to the first signal line SL1 to the second signal line SL2.

For example, a driving signal may be supplied to the second signal line SL2 adjacent to the emission control signal driver 310 through the first link line LL1 and a driving signal may be supplied to the second signal line SL2 located at the other side of the emission control signal driver 310 and the second transmission area TA2 through the first signal line SL1 and the second link line LL2.

As in the exemplary embodiment of FIGS. 7 to 12, the first signal line SL1 and the second signal line SL2 are not disposed in the transmission areas TA1 and TA2 of the optical areas OA1 and OA2 so that the transmittance may be further increased, thereby improving the performance of the optical electronic devices 11 and 12.

The exemplary embodiments of the present disclosure can also be described as follows:

A display device according to an exemplary embodiment of the present disclosure includes a substrate which includes a display area including at least one optical area and a normal area and including a plurality of pixels and a non-display area and a plurality of signal lines extending from both sides of the display area to the plurality of pixels in a row direction, wherein the plurality of signal lines includes a first signal line and a second signal line which are disposed on different rows on both sides of the optical area and transmit the same signal and a detour line which is connected to the first signal line and the second signal line on the both sides of the at least one optical area and detours the at least one optical area.

The detour line may detour along a boundary of the at least one optical area.

The detour line may be disposed along a boundary of at least one transmission area in the at least one optical area.

The detour line may be disposed on the same layer as the first signal line and the second signal line to be integrally formed with the first signal line and the second signal line or may be disposed on a different layer from the first signal line and the second signal line to be connected through a contact hole.

The detour line may include a part extending to a row direction and a part extending to a column direction.

The display device may further include a plurality of power lines which is disposed in the non-display area on both sides of the display area and extends in a column direction, wherein the first signal line and the second signal line are connected to the same power line, among the plurality of power lines.

The plurality of power lines may be branched from a first initialization voltage bus line or a second initialization voltage bus line.

The display device may further include a gate driver which is disposed in the non-display area on both sides of the display area on the substrate, wherein the first signal line and the second signal line are connected to the gate driver.

The gate driver may include at least one scan driver and an emission control driver, and the first signal line and the second signal line are connected to different drivers which output the same signal, among the at least one scan driver and the emission control driver.

The display device may further include a link line which connects the gate driver and the first signal line and the second signal line, wherein the gate driver may include at least one scan driver and an emission control driver and the link line connects at least one driver of the at least one scan driver and the emission control driver to the first signal line and the second signal line.

At least a part of the link line may be disposed between the display area and the plurality of power lines.

The at least one optical area may further include a first optical area and a second optical area adjacent to the first optical area in the row direction and the plurality of signal lines is connected to the gate driver closer to the first optical area, between the first optical area and the second optical area.

The detour line may include a first detour line which is connected to the first signal line and the second signal line on both sides of the first optical area and a second detour line which is connected to the first signal line and the second signal line on both sides of the second optical area.

The detour line may include a part extending in a direction different from an extending direction of the first signal line and the second signal line.

The first signal line may be disposed above or below the second optical area, the second signal line may be disposed on both sides of the second optical area, and the second detour line extends in a column direction.

The at least one optical area may further include a first optical area and a second optical area adjacent to the first optical area in the row direction and the plurality of signal lines is connected to the gate driver closer to the second optical area, between the first optical area and the second optical area.

The first signal line may be disposed above or below the second optical area, the second signal line is disposed on both sides of the second optical area, and a signal is applied to the second signal line disposed between the first optical area and the second optical area through the first detour line.

The substrate may include a hole corresponding to the at least one optical area.

The at least one optical area and the normal area may have different resolutions.

The detour line may be configured by any one of a first gate electrode, a first source/drain electrode, a first metal layer, a second gate electrode, a second source/drain electrode, and a second metal layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate including a display area comprising at least one optical area and a normal area and a plurality of pixels and a non-display area;

a plurality of signal lines extending from at least one side of the display area to the plurality of pixels in a row direction; and a gate driver that is in the non-display area on at least one side of the display area on the substrate, wherein the plurality of signal lines includes:

a first signal line and a second signal line that are on different rows on at least one side of the at least one optical area and transmit a same signal, wherein the first signal line and the second signal line are disposed in adjacent rows, wherein the first signal line and the second signal line are not disposed in the at least one optical area, wherein the plurality of signal lines further include a detour line that is connected to at least one of the first signal line or the second signal line on the at least one side of the at least one optical area and detours the at least one optical area, wherein the first signal line and the second signal line are connected to the gate driver, wherein the gate driver includes at least one scan driver and an emission control driver, and the first signal line and the second signal line are connected to different drivers which output a same signal, among the at least one scan driver and the emission control driver.

2. The display device according to claim 1, wherein the detour line detours along a boundary of the at least one optical area.

3. The display device according to claim 1, wherein the detour line is along a boundary of at least one transmission area in the at least one optical area.

4. The display device according to claim 1, wherein the detour line is on a same layer as the first signal line and the second signal line and integrally formed with the first signal line and the second signal line or is on a different layer from the first signal line and the second signal line and connected through a contact hole.

5. The display device according to claim 1, wherein the detour line includes a part extending to a row direction and/or a part extending to a column direction.

6. The display device according to claim 1, further comprising:

a link line that connects the gate driver and at least one of the first signal line and the second signal line, wherein the gate driver includes at least one scan driver and an emission control driver and the link line connects at least one driver of the at least one scan driver and the emission control driver to at least one of the first signal line and the second signal line.

7. The display device according to claim 6, wherein the link line is branched from the non-display area and connected to at least one of the first signal line and the second signal line.

8. The display device according to claim 6, wherein at least a part of the link line is disposed between the display area and at least one of a plurality of power lines.

9. The display device according to claim 1, wherein the at least one optical area further includes a first optical area and a second optical area that is adjacent to the first optical area in the row direction and the plurality of signal lines are connected to the gate driver closer to the first optical area, between the first optical area and the second optical area.

10. The display device according to claim 9, wherein the detour line includes:

a first detour line that is connected to at least one of the first signal line and the second signal line on both sides of the first optical area; and a second detour line that is connected to at least one of the first signal line and the second signal line on both sides of the second optical area.

11. The display device according to claim 10, wherein the detour line includes a part extending in a direction different from an extending direction of the first signal line and the second signal line.

12. The display device according to claim 11, wherein the first signal line is above or below the second optical area, the second signal line is on both sides of the second optical area, and the second detour line extends in a column direction.

13. The display device according to claim 10, wherein the at least one optical area further includes a first optical area and a second optical area adjacent to the first optical area in the row direction and the plurality of signal lines are connected to the gate driver closer to the second optical area, between the first optical area and the second optical area.

14. The display device according to claim 13, wherein the first signal line is above or below the second optical area, the second signal line is on both sides of the second optical area, and a signal is applied to the second signal line disposed between the first optical area and the second optical area through the first detour line.

15. The display device according to claim 1, wherein the substrate includes a hole corresponding to the at least one optical area.

16. The display device according to claim 1, wherein the at least one optical area and the normal area have different resolutions.

17. The display device according to claim 1, wherein the detour line is configured by any one of a first gate electrode, a first source/drain electrode, a first metal layer, a second gate electrode, a second source/drain electrode, a gate material layer and a second metal layer.

18. The display device according to claim 1, wherein the display area includes one optical area, the gate driver is on one side of the display area, and the first signal line and the second signal line extend in a pixel row direction and are connected via a link line disposed on another side of the display area.

* * * * *